(12) United States Patent
Tell

(10) Patent No.: US 8,365,119 B2
(45) Date of Patent: Jan. 29, 2013

(54) GENERATING INTERFACE ADJUSTMENT SIGNALS IN A DEVICE-TO-DEVICE INTERCONNECTION SYSTEM

(75) Inventor: Stephen G. Tell, Chapel Hill, NC (US)

(73) Assignee: Rambus Inc., Sunnyvale, CA (US)

( * ) Notice: Subject to any disclaimer, the term of this patent is extended or adjusted under 35 U.S.C. 154(b) by 163 days.

(21) Appl. No.: 12/798,971

(22) Filed: Apr. 15, 2010

(65) Prior Publication Data

US 2010/0205343 A1 Aug. 12, 2010

Related U.S. Application Data

(60) Division of application No. 11/321,836, filed on Dec. 29, 2005, now Pat. No. 7,735,037, which is a continuation-in-part of application No. 11/107,121, filed on Apr. 15, 2005, now Pat. No. 7,802,212.

(51) Int. Cl.
*G06F 17/50* (2006.01)
(52) U.S. Cl. .......................... 716/113; 716/101; 716/132
(58) Field of Classification Search .................. 716/101, 716/113, 132
See application file for complete search history.

(56) References Cited

U.S. PATENT DOCUMENTS

| | | | |
|---|---|---|---|
| 5,255,384 A | 10/1993 | Sachs et al. | |
| 5,448,744 A * | 9/1995 | Eifert et al. | 712/40 |
| 6,163,835 A | 12/2000 | Todd et al. | |
| 6,321,282 B1 | 11/2001 | Horowitz et al. | |
| 6,487,626 B2 | 11/2002 | Gray et al. | |
| 6,597,727 B2 | 7/2003 | Philips et al. | |
| 6,694,385 B1 | 2/2004 | Fuoco et al. | |
| 7,003,686 B2 | 2/2006 | Chua-Eoan et al. | |
| 2004/0003331 A1 | 1/2004 | Salmon et al. | |
| 2004/0070409 A1 | 4/2004 | Mobley | |
| 2006/0140321 A1 | 6/2006 | Tell et al. | 375/376 |

FOREIGN PATENT DOCUMENTS

WO 93/02513 2/1993

OTHER PUBLICATIONS

Notice of Allowance for U.S. Appl. No. 12/273,121 dated May 17, 2010, 7 pgs.
Notice of Allowance for U.S. Appl. No. 11/321,836 dated Feb. 1, 2010, 6 pgs.
Office Action for U.S. Appl. No. 11/107,121 dated Oct. 2, 2009, 6 pgs.
Comments on Examiner's Reasons for Allowance for U.S. Appl. No. 11/107,121 dated Aug. 9, 2010, 1 pg.
Response with Submission for U.S. Appl. No. 11/107,121 dated Mar. 2, 2010, 8 pgs.
Tell et al., "Introduction to Plc, Control Bus, and firmware specs," white paper; Aug. 5, 2003, 59 pgt, Rev 1 ..8, Velio Communications, Inc.
Tell et al., "GigaCore Documentation, Chapter 8—Controller and Control Bus," white paper, Jan. 26, 2001,33 pgs., Rev 0.18, Chip2Chip.
Craig et al., "Chapter 6—PIC Controller," white paper, Feb. 20, 2002, pp. 45-84, Rev 0.0, Velio Communications, Inc.
Search Report for corresponding Taiwanese application 095113553.
U.S. Appl. No. 11/021,975.

* cited by examiner

*Primary Examiner* — Thuan Do
(74) *Attorney, Agent, or Firm* — Morgan, Lewis & Bockius LLP

(57) ABSTRACT

Described are a system and method to control interface timing and/or voltage operations of signals transmitted between devices. A processor may be coupled through one or more bus interfaces of a bus to one or more corresponding interface timing and/or voltage comparison circuits and corresponding interface timing and/or voltage adjustment circuits.

15 Claims, 23 Drawing Sheets

50

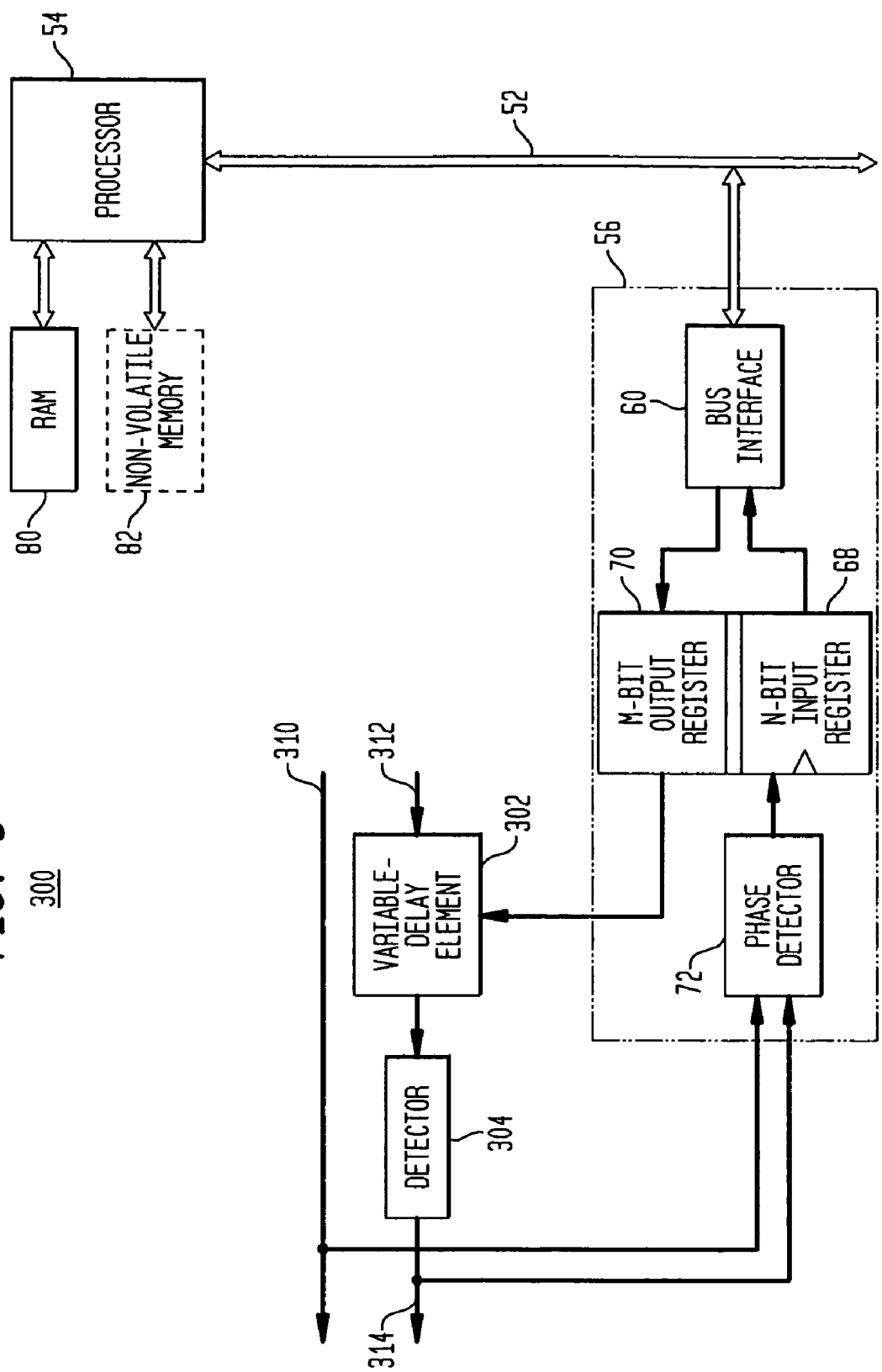

350

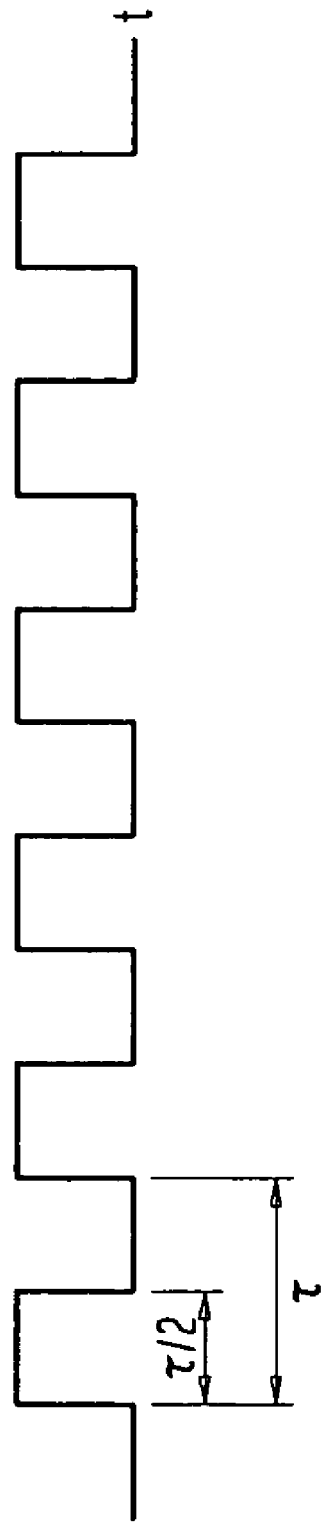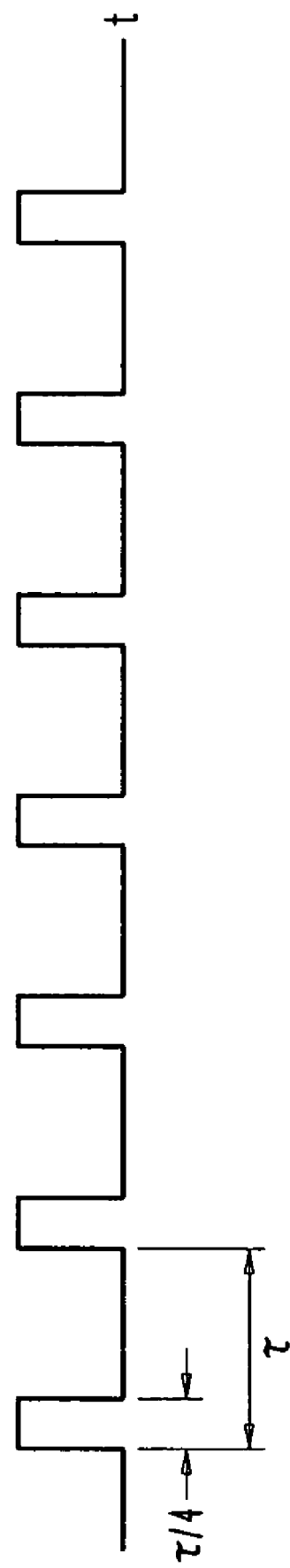

GENERATING INTERFACE ADJUSTMENT SIGNALS IN A DEVICE-TO-DEVICE INTERCONNECTION SYSTEM

CROSS-REFERENCE TO RELATED APPLICATIONS

This application is divisional of U.S. patent application Ser. No. 11/321,836, filed Dec. 29, 2005, which is a continuation-in-part of U.S. patent application Ser. No. 11/107,121, filed Apr. 15, 2005, the disclosures of which are hereby incorporated herein by reference.

BACKGROUND

The subject matter disclosed herein relates to the field of high-speed signaling.

Device-to-device interconnections (DDIs) typically are used to transfer signals between integrated circuit devices (e.g., from a transmitting device to a receiving device). For example, a DDI may comprise multiple parallel links or channels (e.g., between a memory device and a memory controller), or multiple parallel links or channels for transmitting packets or frames formatted according to a communication protocol in a communication system. Alternately or in addition, DDIs may also comprise serial rather than parallel links or channels.

Circuitry related to processing signals transmitted and/or received via links or channels may be adaptively controlled by one or more state machines at the transmitting device and/or the receiving device. As the number of parallel links or channels in a DDI increases to accommodate increased signal transmission rates, the number and/or complexity of such state machines may also increase.

BRIEF DESCRIPTION OF THE FIGURES

Non-limiting and non-exhaustive embodiments will be described with reference to the following figures, wherein like reference numerals refer to like parts throughout the various figures unless otherwise specified.

FIG. 3 is a schematic diagram of an embodiment a system to control interface timing operations for signals transmitted via a DDI.

FIGS. 5 and 6 illustrate properties of signals having a duty cycle.

DETAILED DESCRIPTION

Figure 1:
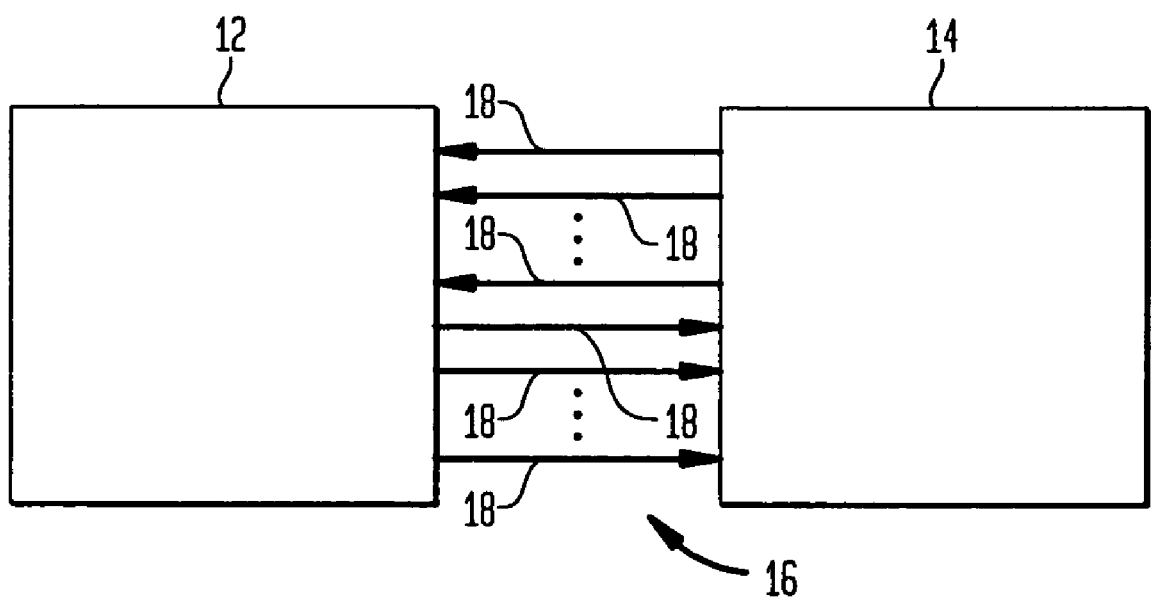
FIG. 1 is a schematic diagram of an embodiment of a system comprising devices coupled by a device-to-device interconnection (DDI).

References throughout this specification to "one embodiment" or "an embodiment" are intended to refer to a particular feature, structure, or characteristic that is included in at least one embodiment of claimed subject matter. Thus, the appearances of the phrase "in one embodiment" or "an embodiment" in various places throughout this specification are not necessarily referring to the same embodiment. Furthermore, the particular features, structures, or characteristics may be combined in one or more embodiments.

A "link" or "channel" as referred to herein relates to one or a combination of transmission media to transmit and/or receive one or more signals from one or more sources to one or more destinations. For example, a link may carry or communicate information in the form of a signal from a transmitting device to a receiving device. Such a signal transmitted via a link or channel may comprise a serial signal encoded according to a particular encoding scheme. However, these are merely examples of a link or channel and signals that may be transmitted via a link, or channel. Claimed subject matter is not limited in scope to these examples.

A "device" as referred to herein relates to an identifiable entity and/or subsystem in an electronic system capable of performing one or more functions. In one particular embodiment, for example, a device may comprise an integrated circuit that is capable of being integrated with other subsystems in the larger electronic system. Such a device may be contained within a distinct integrated circuit package to distinguish the device from other such devices in the electronic system. However, these are merely examples of a device and claimed subject matter is not limited in these respects.

A "device-to-device interconnection" (DDI) as referred to herein relates to one or more links or channels to transmit signals between devices. In one particular embodiment, for example, a DDI may be embodied as conductive traces formed on a circuit board between device sockets to receive devices. Likewise, depending at least in part on the context, the DDI may comprise the traces or it may comprise the sockets and the traces. However, this is merely an example of a DDI and claimed subject matter is not limited in this respect.

An "interface circuit" as referred to herein relates to circuitry and/or logic to transmit, receive and/or process signals transmitted and/or received via a transmission medium or via transmission media. In one particular embodiment, for example, an interface circuit may extract information from received signals that have been transmitted over one or more links. Here, an interface circuit may extract data from and/or otherwise process the signals. In another particular embodiment, for example, an interface circuit may transmit, condition, modulate, encode, synchronize, and/or otherwise perform operations on signals for transmission over one or more links. However, interface circuits may perform a variety of other operations as well. These are merely examples of an interface circuit and its functionality, and claimed subject matter is not limited in these respects.

Processing signals at an interface circuit may be associated and/or correlated with signaling events and/or other timing information. In one particular embodiment, for example, a signal received at an interface circuit may comprise signals provided on particular intervals. Accordingly, to the extent that an interface circuit may extract information from such signals, the interface circuit may execute one or more "interface timing operations." In a particular embodiment, for example, an interface circuit may execute interface timing operations to synchronize circuitry for the detection of information at particular intervals of a received signal. In another particular example, interface timing operations may comprise generation and/or distribution of a clock signal to synchronize operations for the transmission of a signal and/or processing of a received signal, for example. However, these are merely examples of interface timing operations and claimed subject matter is not limited in this respect.

Timing characteristics of a signal may be detected, measured, controlled, altered, manipulated and/or otherwise processed. For example, a timing characteristic of a signal received at an interface circuit may be compared with a timing characteristic of a different, reference signal. Such a comparison may be quantified and/or represented as a "timing comparison signal," which, in this context, refers to a comparison of timing characteristics of the signals. In a particular embodiment, for example, a timing comparison signal may indicate a difference between a phase of an input signal and a phase of a reference signal. However, this is merely an example of a timing comparison signal and claimed subject matter is not limited in this respect.

A "timing comparison circuit" as referred to herein relates to circuitry and or logic for performing a timing comparison and/or generating a timing comparison signal. In one embodiment, for the purpose of illustration, a timing comparison circuit may comprise a phase detector capable of detecting a difference in phase among multiple signals. However, this merely an example of a timing comparison circuit and claimed subject matter is not limited in this respect.

A "memory interface" as referred to herein relates to circuitry and/or logic, whether in the form of hardware, software, or firmware, that relates to methods for communicating with one or more devices capable of storing information in a retrievable format. In a particular embodiment, for example, a memory interface may comprise one or more interface circuits enabling a controller device to access data stored in one or more memory devices. In this embodiment, the memory interface may include interface circuitry on the memory controller, which allows the memory controller to access a memory device. The memory device, in this example, includes a memory interface which facilitates chip-to-chip communication with the memory controller. However, these are merely examples of a memory interface and claimed subject matter is not limited in these respects.

An interface circuit may employ "interface voltage operations" to condition and/or process voltage characteristics of a signal. Likewise, an interface circuit may employ "interface timing operations" to condition and/or process timing characteristics of a signal. In a particular embodiment, for example, an interface circuit may employ interface voltage operations to control at least in part one or more voltage characteristics of one or more signals used in the transmission, encoding, reception, detection, decoding and/or other processing of information. In another particular embodiment, for example, interface voltage operations may detect a change in voltage of a pulse signal to obtain timing information. In yet another particular embodiment, for example, interface timing operations may at least in part control a duty cycle of a clock signal for at least in part controlling transmission of signal. However, these are merely examples of interface voltage and timing operations and claimed subject matter is not limited in these respects.

Interface voltage operations may compare a voltage of a received signal with one or more other voltages (e.g., a reference voltage or voltage of another signal). Such a comparison may be represented and/or quantified as a "voltage comparison signal," which, in this context, refers to a comparison of voltage characteristics of the signals In one embodiment, for example, interface voltage operations may employ a "voltage comparison circuit" that generates such a voltage comparison signal based, at least in part, in input signals. In one particular embodiment, for example, a voltage comparison circuit may comprise one or more comparator devices to generate a signal indicating if a voltage of a first signal exceeds a voltage of a second signal. However, these are merely examples of a voltage comparison signal and voltage comparison circuit, and claimed subject matter is not limited in these respects.

"Instructions" as referred to herein relate to executable expressions or expressions capable of being converted to executable expression which represent one or more logical and/or arithmetic operations. For example, executable instructions may be "machine-readable" by being interpretable by a machine for executing one or more operations on one or more signal values. However, this is merely an example of instructions and embodiments of claimed subject matter are not limited in this respect. In another example, instructions as referred to herein may relate to encoded commands which are executable by a processing circuit comprising a command set which includes the encoded commands. Such an instruction may be encoded in the form of a machine language executable by the processing circuit. Again, these are merely examples of an instruction and embodiments of claimed subject matter are not limited in this respect.

"Storage medium" as referred to herein relates to a medium capable of maintaining or storing instructions and/or other signal values. For example, a storage medium may comprise one or more storage devices for storing machine-readable instructions. Such storage devices may comprise any one of several data storage media types including, for example, magnetic, optical or semiconductor storage media. However, these are merely examples of a storage medium and embodiments of claimed subject matter are not limited in these respects.

A "processor" as referred to herein relates to circuitry and/or logic capable of executing processes and/or procedures according to machine-readable instructions. For example, a processor may retrieve machine-readable instructions from a storage medium, execute processes for processing signals based at least in part on the retrieved instructions and provide a result based at least in part on the processed data. The processor may be embedded on an integrated circuit to support specific predetermined functionality (e.g., on an application specific integrated circuit ("ASIC"). The circuitry embedded to realize the processor functionality may be synthesized using a high level design language description software. In another embodiment, the processor may be implemented using a general purpose integrated circuit processor and may be included in a common package along with integrated circuit memory devices in accordance with a system-in-package ("SIP") approach. In particular embodiments, for example, a processor may be characterized as a "controller," "microcontroller," "microprocessor" and/or other programmable logic device capable of executing instructions. However, these are merely examples of a processor and claimed subject matter is not limited in these respects.

A "bus" as referred to herein relates to a structure and/or logic enabling multiple devices or circuits to communicate among one another. In one embodiment, a bus may be implemented on-chip to support on-chip communication between circuits of that chip. In another embodiment, a bus may be implemented off-chip to support communication between and/or among a plurality of chips. A bus can be one example of a link or channel. In a particular embodiment, for example, a bus may couple processor to one or more devices or circuits to enable signals to be communicated between the processor and one or more devices. However, this is merely an example of a bus and claimed subject matter is not limited in these respects.

A "bus interface" as referred to herein relates to circuitry and/or logic enabling a device or circuit coupled to a bus to communicate with one or more other devices or circuits coupled to the bus. In a particular embodiment, for example, communication may occur via a bus and bus interface in which a device has write access to various registers of the bus interface or a device has read access to various registers of a bus interface. For example, a bus interface may comprise a transmitting interface for transmitting signals via a bus or a bus interface may comprise a receiving interface for receiving signals via a bus. Thus, signals may be transmitted by writing to various registers of a bus interface and signals may be received by reading from various registers of a bus interface. However, these are merely examples of a bus interface and claimed subject matter is not limited in these respects.

In one embodiment, signals may be transmitted between devices in multiple links of a DDI. To enable the reliable transmission of information via signals over the links, timing and/or voltage characteristics of the signals may be processed and/or controlled. In one particular embodiment, for the purpose of illustration, one or more timing characteristics may be at least in part controlled and/or adjusted continually and/or from time to time to enable the extraction of reliable timing and/or other information of a signal. However, this is merely an example and claimed subject matter is not limited in this respect.

According to an embodiment, a processor may be programmed to at least in part control interface timing operations in connection with signals transmitted between devices. The processor may be coupled through multiple bus interfaces of a bus to multiple interface timing comparison circuits and corresponding multiple interface timing adjustment circuits. Through the bus interfaces, the processor may receive multiple interface timing comparison signals from the multiple interface timing comparison circuits and transmit multiple corresponding interface timing adjustment signals to the multiple interface timing adjustment circuits. The processor may determine the interface timing adjustment signals based, at least in part, on the received multiple interface timing comparison signals. However, this is merely an example embodiment and claimed subject matter is not limited in scope to this particular embodiment.

FIG. 1 is a schematic diagram of an embodiment 10 of a system comprising devices 12 and 14 coupled via a DDI 16. The DDI 16 comprises a plurality of links or channels 18 which individually may be capable of transmitting and/or receiving one or more signals between devices 12 and 14. Accordingly, devices 12 and 14 may include a transceiver capable of transmitting and receiving signals on corresponding links or channels 18. However, in one specific embodiment, individual ones of the links or channels may be dedicated to transmitting signals in a particular direction (e.g., from device 12 to device 14 or from device 14 to device 12). However, claimed subject matter is not limited in this respect.

In one embodiment, links or channels 18 may be formed, at least in part, from copper traces of a printed circuit board, or in combination with device sockets to couple device pins of devices 12 and 14 to the copper traces. According to an embodiment, signals transmitted via links or channels 18 may be modulated. As such, for any particular link or channel 18, a serial signal may be encoded to represent bits according to any one of several encoding formats, such as, for example, non-return to zero encoding. However, this is merely an example and claimed subject matter is not limited in this respect. Signals representing serial data may be further organized into code groups, such as 8B/10B code groups. Again, this is merely an example and claimed subject matter is not limited in this respect.

According to an embodiment, system 10 may comprise a memory interface. Here, for the purpose of illustration, device 12 may comprise one or more memory devices (e.g., dynamic random access memory (DRAM) or static random access memory (SRAM), synchronous DRAM (SDRAM), double data rate (DDR) SDRAM, etc.) and device 14 may comprise a corresponding memory controller that is capable of retrieving data from and/or writing data to the one or more memory devices according to a memory interface format. Alternatively, devices 12 and/or 14 may be capable or transmitting and/or receiving signals according to a predetermined protocol. In this particular embodiment, for example, devices 12 and 14 may be capable of transmitting and/or receiving frames and/or packets formatted according to a predetermined communication protocol through DDI 16. However, these are merely examples and claimed subject matter is not limited in scope to these examples.

Figure 2A:
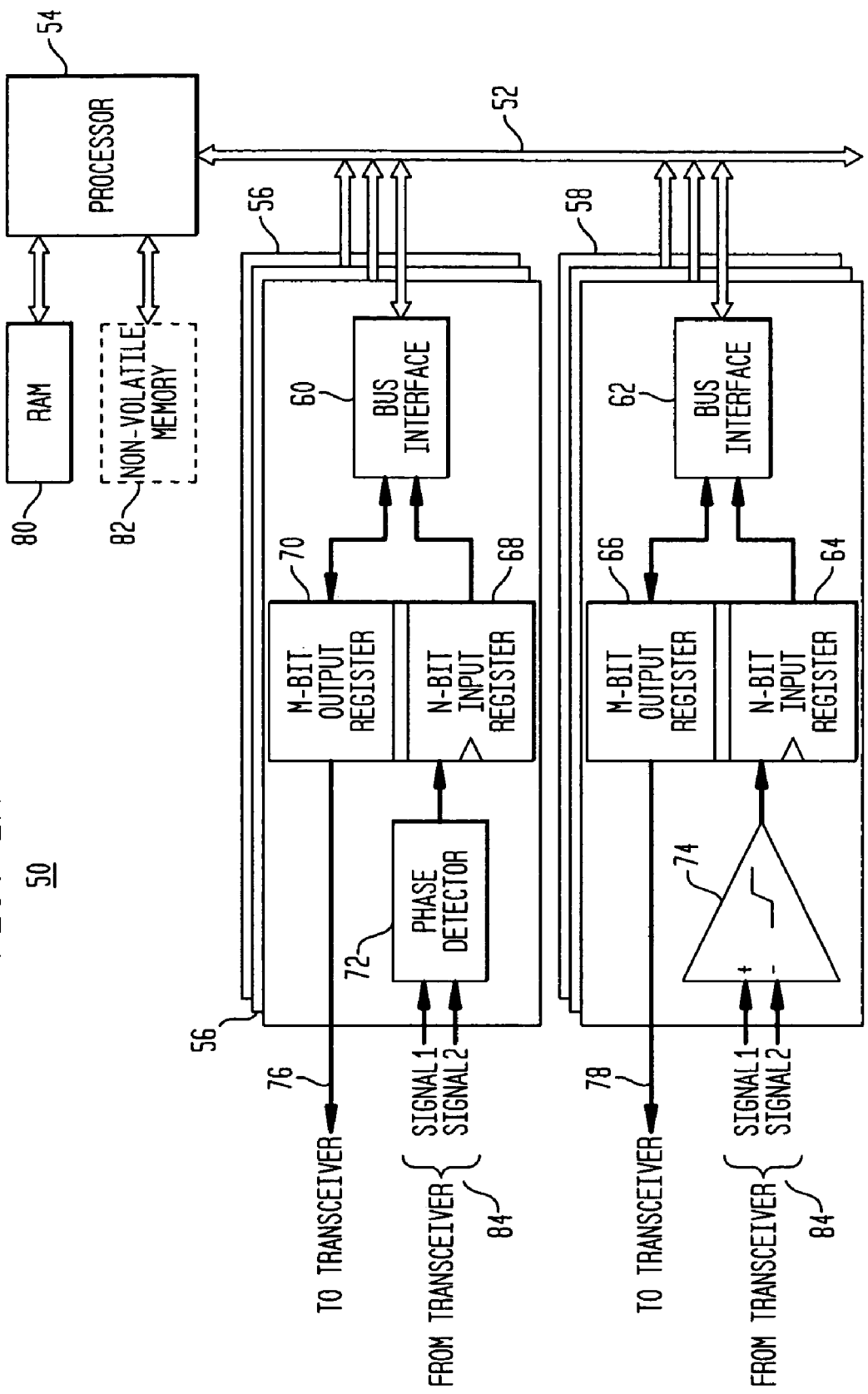
FIG. 2A is a schematic diagram of an embodiment of a system to control interface timing and/or voltage operations for signals transmitted via a DDI.

FIG. 2A is a schematic diagram of an embodiment circuitry to at least in part control interface timing and/or voltage operations for processing of signals transmitted and/or received via a DDI, such as for the system embodiment shown in FIG. 1. A system 50 comprises multiple interface timing control circuits 56 and multiple interface voltage control circuits 58 that may be associated with corresponding multiple links of a DDI. Corresponding signals may be associated with and/or used in voltage and/or timing operations. Here, for example, a particular interface timing control circuit 56 may generate an interface timing comparison signal based, at least in part, on a signal 84 received from a corresponding link of the DDI.

According to an embodiment, a bus 52 couples a processor 54 to multiple bus interfaces 60 with multiple corresponding interface timing control circuits 56, and to multiple bus interfaces 62 with multiple corresponding interface voltage control circuits 58. Here, the multiple bus interfaces 60 may receive interface timing comparison signals from corresponding registers 68 and the multiple bus interfaces 62 may receive interface voltage comparison signals from corresponding registers 64. Bus 52 may then transmit multiple interface timing comparison signals and multiple interface voltage comparison signals to processor 54 for processing. However, claimed subject matter is not limited in scope to this example embodiment.

In a particular embodiment, for example, processor may execute one or more processes to determine multiple interface timing adjustment signals based, at least in part, on corresponding multiple interface timing comparison signals. Bus 52 may then transmit multiple interface timing adjustment signals to corresponding registers 70 through bus interfaces 60. Multiple interface timing adjustment signals 76 may then be employed in adjustment of one or more timing characteristics of signal 84, for example, in a closed feedback loop. However, this is merely an example and claimed subject matter is not limited in scope to this example embodiment.

Similarly, according to a particular embodiment, processor 54 may execute one or more processes to determine multiple interface voltage adjustment signals based, at least in part, on corresponding multiple interface voltage comparison signals. Bus 52 may then transmit multiple interface voltage adjustment signals 78 to corresponding registers 66 through bus interfaces 62. Multiple interface voltage adjustment signals may then enable adjustment of one or more voltage characteristics of signal 84, for example, in a closed feedback loop. However, again, this is merely an example embodiment and claimed subject matter is not limited in this respect.

According to an embodiment, processor 54 may at least in part control and/or adjust one or more timing characteristics and/or one or more voltage characteristics of signals 84 in multiple, independent closed feedback loops (e.g., independent feedback loops for the control of individual links in a DDI and/or independent feedback loops for the control of voltage and timing characteristics of the links). Accordingly, in this particular embodiment, a particular bus interface 60 (or 62) corresponding with a particular link may individually receive an interface timing (or voltage) comparison signal and provide a corresponding interface timing (or voltage) adjustment signal for controlling, at least in part, one or more timing (or voltage) characteristics of the particular corresponding signal 84.

In one embodiment, devices 12 and 14 may initialize voltage and/or timing characteristics during a start-up mode after power is applied, and then transition to an operational mode following calibration of links or channels 18 (e.g., for voltage and/or timing characteristics, etc.). In a particular embodiment, processor 54 may be used for controlling interface voltage and/or timing characteristics of signals 84 in the aforementioned closed feedback fashion during the start-up mode to account for particular physical characteristics of loops being controlled. In another embodiment, the processor may continue controlling the interface voltage and/or timing characteristics of signals 84 during the operational mode while signals transmitted via DDI 16 (e.g., signals for a memory interface or signal packets and/or frames formatted according to a communication protocol). By employing feedback control to make adjustments to timing and/or voltage characteristics of signals 84, signals may be communicated via DDI 16 at increased speeds and/or with reduced data transmission errors as compared to communication without feedback control.

In addition to controlling interface voltage and/or timing characteristics of signals, processor 54 may also control power management functions. Here, for example, processor 54 may activate a start-up subsystem that performs, among other things, a calibration of links or channels 18 in response to detection of a start-up event. Processor 54 may then deactivate the start-up system upon detection of a condition and/or event such as, for example, sufficient calibration of links and/or channels 18. However, this is merely an example of how a processor may control power management functions of an interface circuit and claimed subject matter is not limited in these respects.

Also, processor 54 may be used for the execution of one or more built-in self test (BIST) functions that may be employed for gathering and/or analyzing health and/or status information. Here, for example, processor 54 may communicate health and/or status information to external devices according to a predetermined format. However, this is merely an example of how a processor may be used for the implementation of BIST functions and claimed subject matter is not limited in these respects.

According to an embodiment, processor 54 may comprise any one of several alternative processing circuit cores capable of executing machine-readable instructions provided according to a programmable processing instruction set. For example, processor 54 may comprise a controller, microcontroller or microprocessor embodying any one of several possible processor architectures (e.g., reduced instructions set computer, complete instruction set computer, single core, multi-core, etc.). However, these are merely examples and claimed subject matter is not limited to these examples.

According to an embodiment, processor 54 may execute machine-readable instructions which are stored in a memory device, such as RAM 80 and/or non-volatile memory 82. RAM 80 may be embodied as embedded SRAM for use by processor 54 as a system memory for storing data and/or instructions for processes that are currently executing. However, this is merely an example and claimed subject matter is not limited in this respect. Non-volatile memory device 82 may be embodied as an electrically erasable programmable read-only memory (EEPROM) device and/or flash memory device capable of storing machine-readable instructions and/or data. Here, the non-volatile memory device 82 may store machine-readable instructions for the execution of processes such as, for example, an operating system and/or processes for determining the aforementioned interface timing adjustment signals and/or interface voltage adjustment signals. However, these are merely examples and claimed subject matter is not limited in this respect.

According to an embodiment, bus 52 may be embodied as a multiplexed bus enabling processor 54 to transmit signals to or receive signals from multiple devices (e.g., multiple interface timing control circuits 56 and/or multiple interface voltage control circuits 58). Here, such multiple devices may be communicatively coupled to bus 52 by corresponding bus interfaces associated with the multiple devices. However, this is merely an example and claimed subject matter is not limit in this respect.

According to an embodiment, processor 54 may be capable of reading data from and/or writing data to registers 64, 66, 68 and 70 by initiating read and/or write transactions on bus 52 according to a bus I/O protocol. For example, one or more processes executing on processor 54 may define a memory map identifying addressable memory locations, such as memory locations available in RAM 80 and/or non-volatile memory 82. Such a memory map may also define registers 64, 66, 68 and 70 as memory locations that are addressable via bus interfaces 60 and 62. Accordingly, processes executing on processor 54 may read data from and/or write data to these registers by addressing bus transactions to these devices. In an alternative embodiment, processor 54 may address read and/or write transactions to registers 64, 66, 68 and 70 according to physical locations of associated bus interfaces 60 and 62 on bus 52. However, these are merely examples and claimed subject matter is not limited in this respect. Likewise, as illustrated, registers 66 and 70 in this particular embodiment may apply signals to a transceiver for communication via the DDI. Similarly, signals may be received via the DDI and applied to interface timing and voltage control circuits 56 and 58.

According to an embodiment, system 50 may be formed on a single semiconductor die. In alternative embodiments, processor 54, RAM 80 and/or non-volatile memory 82 may reside on devices separate from interface timing and voltage control circuits 56 and 58. It should be understood, however, that these are merely alternative methods for integrating components of system 50 and claimed subject matter is not limited in these respects.

In the single die embodiment, for example, machine-readable instructions for executing a process to determine timing and/or voltage adjustment signals based, at least in part, on comparison signals may embodied in non-volatile memory 82. Alternatively, these instructions may be updated and/or re-written through an external programming port (not shown). In yet another alternative, non-volatile memory 82 may be located on a device separate from processor 54. Here, these instructions may be updated and/or re-written by updating the instructions of the separate device or replacing the separate device with non-volatile memory containing updated instructions. However, again, these are merely examples and claimed subject matter is not limited in these respects.

In one embodiment, signals 84 may comprise one or more signal components and a timing comparison signal may be based, at least in part, upon a detected phase of at least one of the signal components at a phase detector 72. However, this is merely an example embodiment and claimed subject matter is not limited in this respect. For example, timing comparisons may be made without employing a phase detector in alternate embodiments.

Similarly, a particular voltage control circuit 58 may generate an interface voltage comparison signal based, at least in part, on signals received from a corresponding link of the DDI. In one embodiment, a voltage comparison signal may be based, at least in part, upon one or more voltage characteristics (e.g., a peak signal voltage of an oscillating signal) which are detectable at a voltage comparator 74. However, this is merely an example and claimed subject matter is not limited in this respect.

FIG. 3 is a schematic diagram of an embodiment 300 of a system to at least in part control interface timing operations. For simplicity, FIG. 3 shows a single timing control circuit 56 coupled to processor 54 through bus 52 for the purpose of illustrating control of timing operations for a single link of a DDI. However, it should be apparent that, as illustrated in FIG. 2, system 300 may comprise multiple interface timing control circuits 56 coupled to processor 54 through bus 52 which correspond with multiple links of the DDI.

Here, system embodiment 300 may comprise a delayed lock loop (DLL) type control of signals used in processing other signals received via one or more links of the DDI. However, this merely an example of a particular interface timing operation that may be controlled by a processor and claimed subject matter is not limited in this respect. For example, a processor may be used to control other such interface timing operations such as, for example, clock and data recovery, bit error rate (BER) analysis for built-in self test operations, process monitors and/or other miscellaneous tracking loops. Again, these are merely examples and claimed subject matter is not limited in scope to these examples.

According to an embodiment, timing control circuit 56 may be coupled to a variable delay element 302 and a buffer 304 to synchronize input clock signal 312 with reference clock signal 310. As system 300 may comprise multiple interface timing control circuits 56 corresponding with multiple links of a DDI, system 300 may similarly comprise multiple pairings of a buffer, such as 304, and a variable delay element, such as 302, coupled to corresponding multiple interface timing control circuits 56 for synchronizing multiple corresponding input clock signals, such as 312.

In a particular embodiment, buffer 304 may distribute a delayed input clock signal 314 to a load comprising multiple circuits which are to be synchronized by delayed input clock signal 314. Input clock signal 312 may be generated by, for example, a clock and data recovery circuit (not shown). However, this is merely an example and claimed subject matter is not limited in this respect. Reference clock signal 310 may also be generated by a clock and data recovery circuit. In the illustrated embodiment, it may be desired to synchronize the phases of the reference and input clock signals 310 and 312. While buffer 304 may introduce a delay in input clock signal 312, variable delay element 302 may introduce an additional delay to synchronize the phases of reference clock signal 310 and delayed input clock signal 314.

Variable delay element 302 may transmit input clock signal 312 to buffer 304 and may impart a delay to the transmitted input clock signal based, at least in part, on a control signal provided via output register 70. Buffer 304 may also impart a delay to the input clock signal and the serially combined variable delay element 302 and buffer 304 impart a total delay to input clock signal 312. In one embodiment, for example, variable delay element 302 may impart a delay to input clock signal 312 such that a phase of a delayed input clock signal 314 generated at an output port of buffer 304 is synchronized with and/or substantially matches a phase of reference clock signal 310. However, this is merely an example embodiment and claimed subject matter is not limited in this respect.

According to an embodiment, a phase detector circuit may determine a difference (e.g., a time difference) between the phase of delayed input clock signal 314 and the phase of reference clock signal 310. Such a phase detector may be formed using techniques known to those of ordinary skill in the art of digital and/or analog circuit design. Thus, claimed subject matter is not limited in scope to any particular phase detector or even to use of a phase detector. Nonetheless, phase detector 72 may detect and/or quantify a phase difference as a digital input signal provided to input register 68. Processor 54 may then read the digital input signal from register 68 via bus interface 60 and bus 52.

According to an embodiment, processor 54 may determine an amount of delay to be imparted to input clock signal 312 based, at least in part, on the digital input signal read from register 68. Processor 54 may then determine an adjustment in the delay of the input clock signal 312 as imparted by variable delay element 302, and write a digital output signal to register 70 via bus 52 and bus interface 60. Reading the digital output signal from register 70, variable-delay element 302 may then impart a delay to input clock signal 312 based, at least in part, on the digital output signal.

Figure 4:
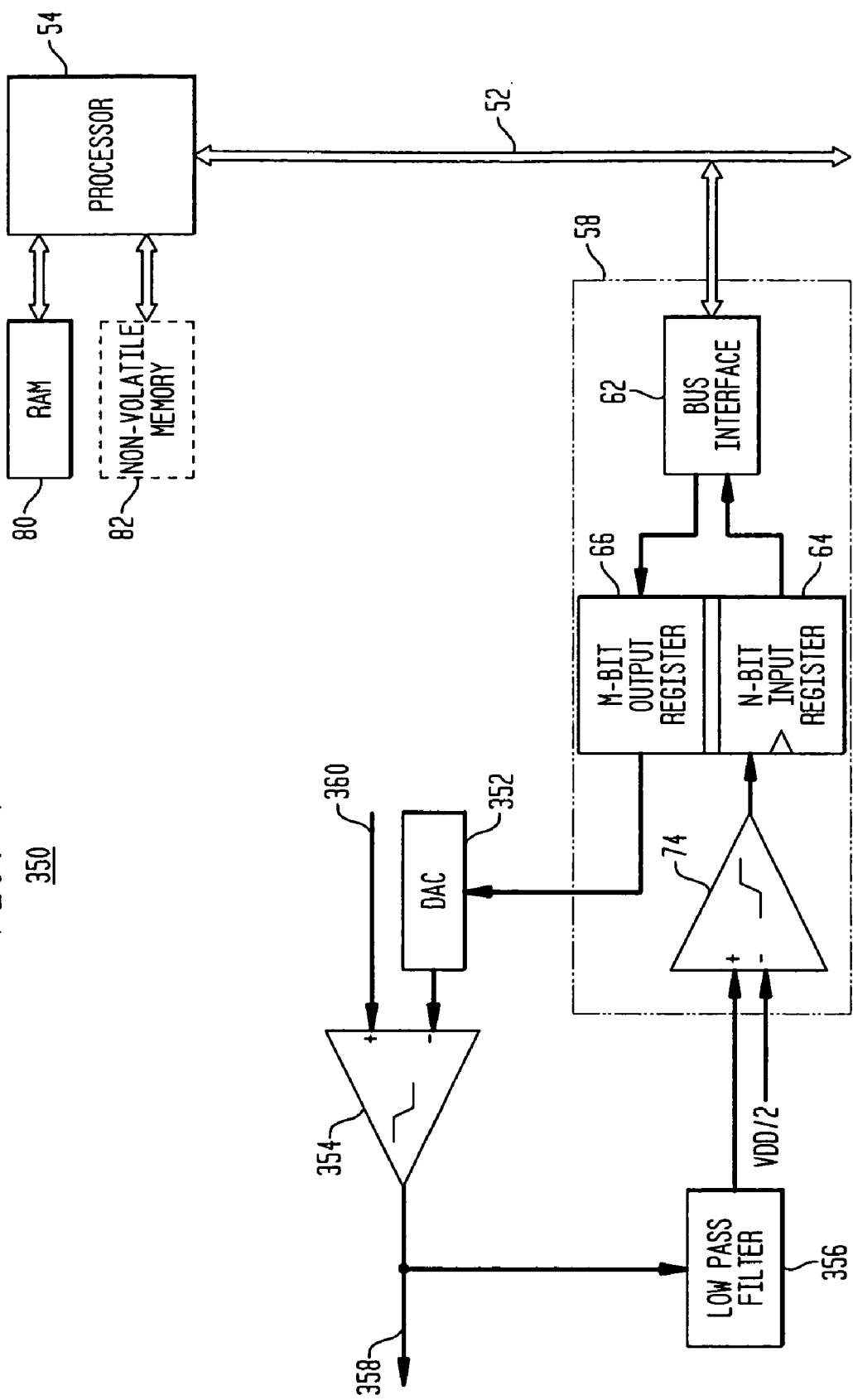
FIG. 4 is a schematic diagram of an embodiment of a system to control interface voltage operations for signals transmitted via a DDI.

FIG. 4 is a schematic diagram of an embodiment 350 of a system to control interface voltage operations, such as those previously described, for example. For simplicity, FIG. 4 shows a single voltage control circuit 58 coupled to processor 54 through bus 52 for the purpose of illustrating control of interface voltage operations for a single link of a DDI. However, it should be apparent that, as illustrated in FIG. 4, system 350 may comprise multiple voltage control circuits 58 coupled to processor 54 through bus 52 which correspond with multiple links of the DDI.

Here, system 350 may comprise a duty cycle correction feature for signals received via one or more links of the DDI. However, this merely an example of a particular interface voltage operation that may be controlled at least in part by a processor and claimed subject matter is not limited in this respect. For example, a processor may be used to control other interface voltage operations such as, for example, offset cancellation, input slice-level setting, transmit and/or receive equalization calibration and ODT calibration. Again, these are merely examples of interface voltage operations that may be controlled at least in part by a processor and claimed subject matter is not limited in this respect.

According to an embodiment, an input signal 360 may comprise a pulse signal having a particular duty cycle property. In a particular embodiment, for example, a period of the input signal 360 may contain a single pulse and a duty cycle may represent a portion and/or percentage of the period that contains the pulse. FIG. 5 illustrates a pulse signal having a period τ and a pulse that extends for τ/2 over the period. Accordingly, the pulse signal of FIG. 5 comprises a duty cycle of ½ or 50%. Similarly, FIG. 6 shows a pulse signal having a period τ and a pulse that extends for τ/4 over the period. Accordingly, the pulse signal of FIG. 6 comprises a duty cycle of ¼ or 25%. However, again, these are merely examples.

According to an embodiment, an output signal 358 may comprise a pulsed signal used as a transmit clock signal. In one particular embodiment, transmission of one or more signals may be synchronized to leading and trailing edges of the pulse signal as employed for double data rate transmission formats, for example. Here, it may be desired to control the duty cycle (and therefore the time between leading and trailing edges of the pulse signal) to be at about 50% to evenly space data transmission intervals. However, this is merely an example and claimed subject matter is not limited in this respect.

In the presently illustrated embodiment, an input signal 360 is applied to a first input port of a voltage comparator 354. In one embodiment, input signal 360 may comprise a ramp signal. A second input of comparator 354 is coupled to receive an output voltage from a digital to analog converter (DAC) 352. When input signal 360 is a ramped signal, it may be characterized with a non-zero rise time "tr," a non-zero fall time "tf" and a period "tper." The duty cycle of output signal 358 may then range from (tper−tr−tf)/(2*tper) to (tper+tr+tf)/(2*tper). Having tr and tf roughly equal tper/2 may allow for an output duty-cycle range of 0% to 100%.

DAC 352 may receive M binary control bits as an input signal from output register 66. Processor 54 may determine the value of the M-bits in register 66 by updating an adjustment signal via bus 52 and bus interface 62 based, at least in part, on a voltage comparison. In operation, output signal 358 may toggle between 0v and $V_{DD}$ in response to voltages at input terminals of comparator 354. Output signal 358 may be provided to a first input terminal of a voltage comparator 74 through a low-pass filter 356 (e.g., a resistor-capacitor filter). An output voltage from low-pass filter 356 may be at about half of $V_{DD}$ (i.e., $V_{DD}/2$) for a duty cycle of 50% at the output port of comparator 354. Accordingly, if the duty cycle exceeds 50%, the output voltage of low-pass filter 356 exceeds $V_{DD}/2$, resulting the output signal of voltage comparator 74 to be high. Register 64 may capture this signal output of voltage comparator 74 as an interface voltage comparison signal to be read by processor 54 through bus 52. Processor 54 may then update the interface voltage adjustment signal of register 66 to increase or decrease the duty cycle of output signal 358 based, at least in part, on the interface voltage comparison signal received at register 64.

According to one embodiment, DDI 16 may couple devices 12 and 14 as "master" and "slave" components in which the operations of a slave device is governed, at least in part, by control signals from a master device. In one particular embodiment, for example, master and slave devices may comprise a memory device (e.g., acting as a "slave") and a memory controller (e.g., acting as a "master") for controlling the storage and retrieval of information from the memory device. However, these are merely examples of devices forming a master and slave relationship, and claimed subject matter is not limited in these respects.

Figure 2B:
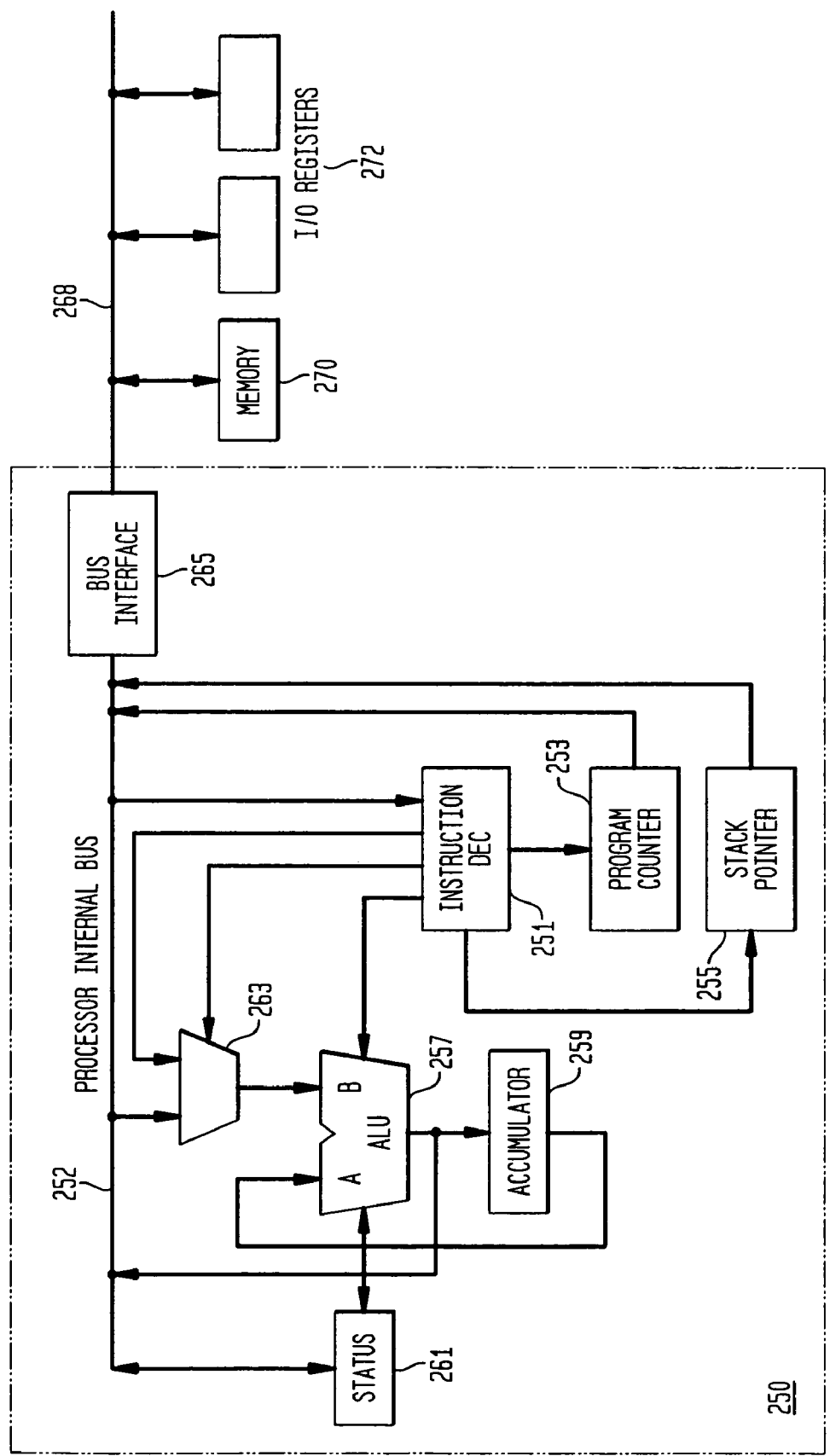
FIG. 2B is a schematic diagram of an embodiment of a processor.

It is noted that processor 54 may comprise any one of a number of processor architectures and claimed subject matter is not limited to any particular architecture. Nonetheless, FIG. 2B is schematic diagram of a possible processor embodiment, denoted in FIG. 2B as 250. Here, processor 250 comprises an instruction decoder 251, program counter 253, stack pointer 255, arithmetic-logic unit 257 (ALU), accumulator 259, status register 261, multiplexer 263, internal bus 252 and bus interface 265. During run-time operation, program counter 253 is stepped through a sequence of addresses, jumping to out-of-sequence addresses in response to jump instructions (or branch instructions or the like) and, in the case of conditional jump instructions, based on contents of status register 261. During an instruction execution cycle, an instruction is fetched from a location within memory 270 indicated by program counter 253, and loaded into instruction decoder 251. Here, internal bus 252 includes separate address and data buses that are used to carry addressing information (e.g., the value of the program counter 253 being supplied to memory 270 via bus interface 265 and an external bus 268) and data/instructions, respectively. In an alternative embodiment, internal bus 252 and/or external bus 268 may comprise a time multiplexed bus to carry both addresses and data/instructions at different times. In either case, after an instruction has been fetched from memory 270 and loaded into instruction decoder 251, the instruction is decoded by instruction decoder 251 and used to control the operations of ALU 257, multiplexer 263, accumulator 259, program counter 253, stack pointer 255 and bus interface 265. For example, if the instruction indicates a memory read or write operation, memory is read at a location indicated by the instruction (which may reference an index register or other source of indirect address computation, not shown) and stored within accumulator 259 via multiplexer 263 and ALU 257. If an instruction indicates an arithmetic or logical operation is to be carried out using the contents of accumulator 259, the instruction decoder issues control signals to ALU 257 to indicate the nature of the operation, and issues control signals to multiplexer 263 to select the source of a second operand, if any. For example, if the second operand is part of the instruction loaded into instruction decoder 251, multiplexer 263 is set to pass the second operand from the instruction decoder to the 'B' input port of ALU 257. If the second operand is being fetched from memory 270 or is sourced by status register 261 or ALU 257 itself, the second operand is driven onto internal bus 252 and passed to the 'B' input port of the ALU via multiplexer 263. The contents of accumulator 259 may be supplied to the 'A' input port of ALU 257 so that the specified arithmetic or logical operation may be carried out on the operands supplied to the 'A' and 'B' input ports of ALU 257, with the result being re-loaded into accumulator 259 and/or passed to processor internal bus 252 (e.g., to be written to memory 270, re-circulated to the 'B' input port of ALU 257, or to be loaded into another register within the processor). The result of a given logical or arithmetic operation within ALU 257 may result in one or more flags being set within the status register (e.g., overflow, underflow, zero, error, etc.), with such flags being supplied to other circuit blocks within the processor via processor internal bus 252 or other signal paths (not shown). For example, the flags may supplied to instruction decoder 251 to enable the instruction decoder to make conditional jump decisions, in which case, instruction decoder 251 may signal the program counter to load a new address sourced by internal bus 252, accumulator 259, ALU 257, or other address source. Stack pointer 255 is provided to keep track of a top-of-stack location within memory 270 and is decremented and incremented in response to stack push and pop instructions decoded by instruction decoder 251.

Memory 270 may include multiple different storages including, without limitation, a non-volatile storage to store program code and static data values, and a random-access-memory (RAM) to store program variables and the program stack. Also, memory 270 or any portion thereof may be included within the processor core in alternative embodiments, rather than being accessed via external bus 268. Input/output registers 272 may be memory mapped and therefore accessed via external bus 268 in response to corresponding addresses, or may be input/output mapped, and thus accessed in response to input/output instructions.

It should be noted that while a particular processor architecture has been described, the processor may alternatively comprise any general purpose or special purpose processor, controller and/or microcontroller that may be used for the execution of instructions, such as those formatted, compiled, translated, or otherwise derived from high-level programming languages, regardless of type (e.g., procedural, object oriented or any other type of programming language,) into machine-readable instructions.

Figure 7:
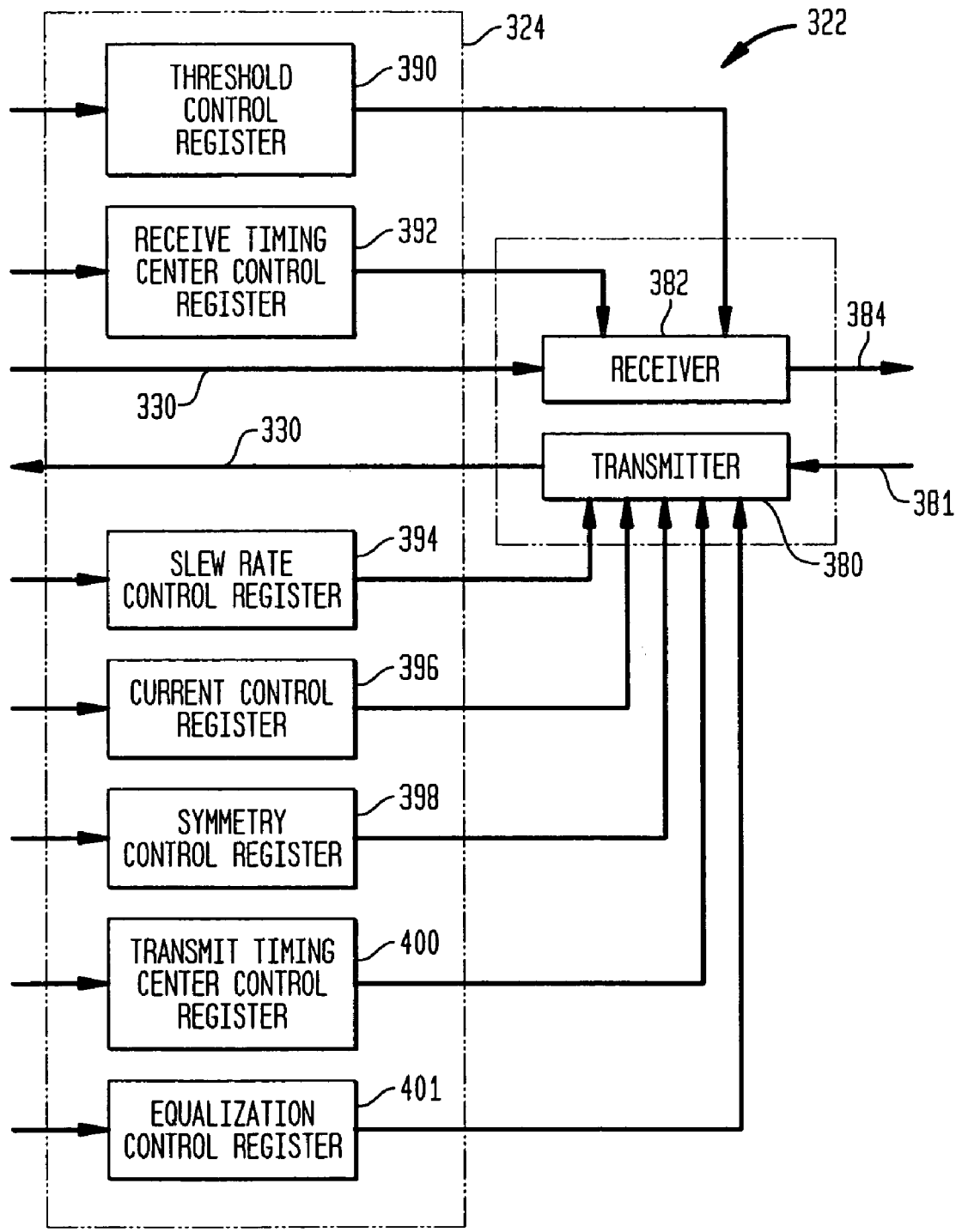
FIG. 7 is a schematic diagram of an embodiment of an interface device.

FIG. 7 is a schematic diagram of an embodiment of an interface 322 to transmit and/or receive signals. Here, interface 322 may be capable of adjusting interface timing and/or interface voltage operations affecting one or more of several receive and/or transmit signal characteristics. For the purposes of this discussion, signals being received refer to signals that arrive from a separate device via the DDI and signals being transmitted refer to signals directed to a separate device via the DDI. According to an embodiment, as previously described, processor 54 may be coupled to any one of several types of registers for controlling interface timing and/or voltage operations of an interface circuit based, at least in part, on timing and/or voltage comparison signals as part of a closed feedback loop. For example, interface 322 may comprise control registers 324, transmitter 380 and receiver 382. According to a particular embodiment, control registers 324 may be addressable by processor 54 via bus 52 to receive timing and/or voltage adjustment signals. Similarly, processor 54 may determine such timing and/or voltage adjustment signals based, at least in part, upon interface timing comparison signals and/or interface voltage comparison signals from corresponding interface timing and/or voltage comparison circuits in a feedback control loop as illustrated above.

In the illustrated embodiment, control registers 324 comprise two registers for adjustment signals associated with receive signal characteristics. For example, threshold control register 390, permits adjustment of the value of $V_{ref}$ for received signals, in which $V_{ref}$ determines the voltage level between 0 and 1 signal values. Likewise, receive timing center control register 392, permits adjustment of a receive clock signal so that a received signal is sampled near the center of a "data eye" representing a period of the signal containing valid data.

Control registers 324, as illustrated, may also include four registers for storing adjustment signals associated with transmit signal characteristics. For example, slew rate control register 394 may receive an adjustment signal from processor 54 for adjusting the slew rate of transmitted signals. Current control register 396 may receive an adjustment signal from processor 54 for producing full swing signals at the output pins of a transmitter device. Symmetry control register 396 may receive an adjustment signal from processor 54 for adjusting the voltage level of transmitted signals with respect to $V_{ref}$. Transmit timing center control register 400 may receive an adjustment signal from processor 54 for adjusting a transmit clock signal so the transmitted signal will be received near the center of the data eye. Equalization control register 401 may receive an adjustment signal from processor 54 for equalizing the transmitted signal to account for temporal and/or spatial variations in voltage margins. In alternate embodiments, control registers may include a slew rate control register, a current control register, a symmetry control register, a transmit timing center control register and one set of equalization control register. However, these are merely examples of registers that may be used for receiving timing and/or voltage adjustment signals from a processor to affect interface timing and/or voltage operations, and claimed subject matter is not limited in these respects.

Transmitter 380 may receive internally generated data on line 381, buffer the received data and drive the transmit data to lines 330. In a particular embodiment, transmitter 380 may also adjust the parameters of the transmit data in response to timing and/or voltage adjustment signals stored in control registers 324 by processor 54. FIGS. 8-12 and FIGS. 18A-18B below discuss how transmitter 380 may adjust the various parameters of the transmit data according to a particular embodiment.

Figure 13:
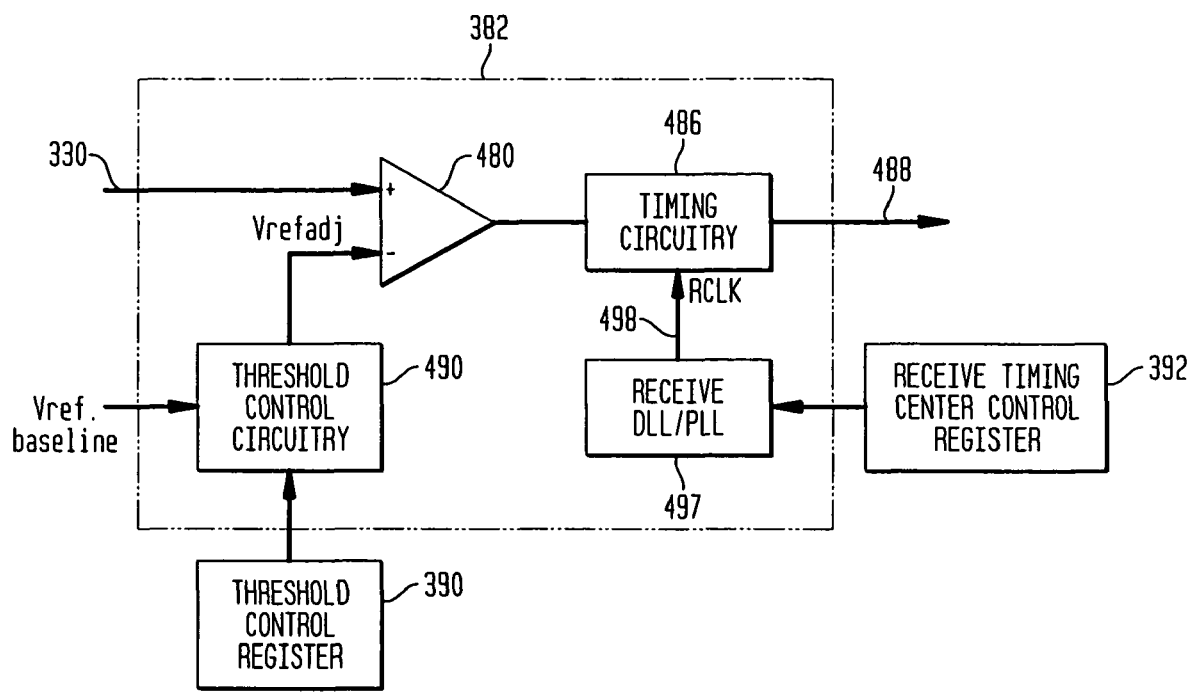
FIG. 13 is schematic diagram of a portion of the embodiment of FIG. 7.
Figure 14:
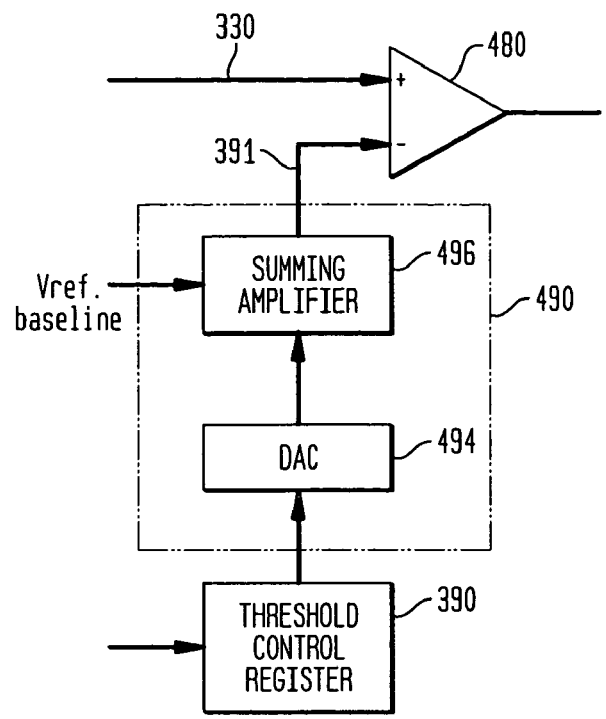
FIG. 14 is a schematic diagram of a portion of the embodiment of FIG. 13.
Figure 15:
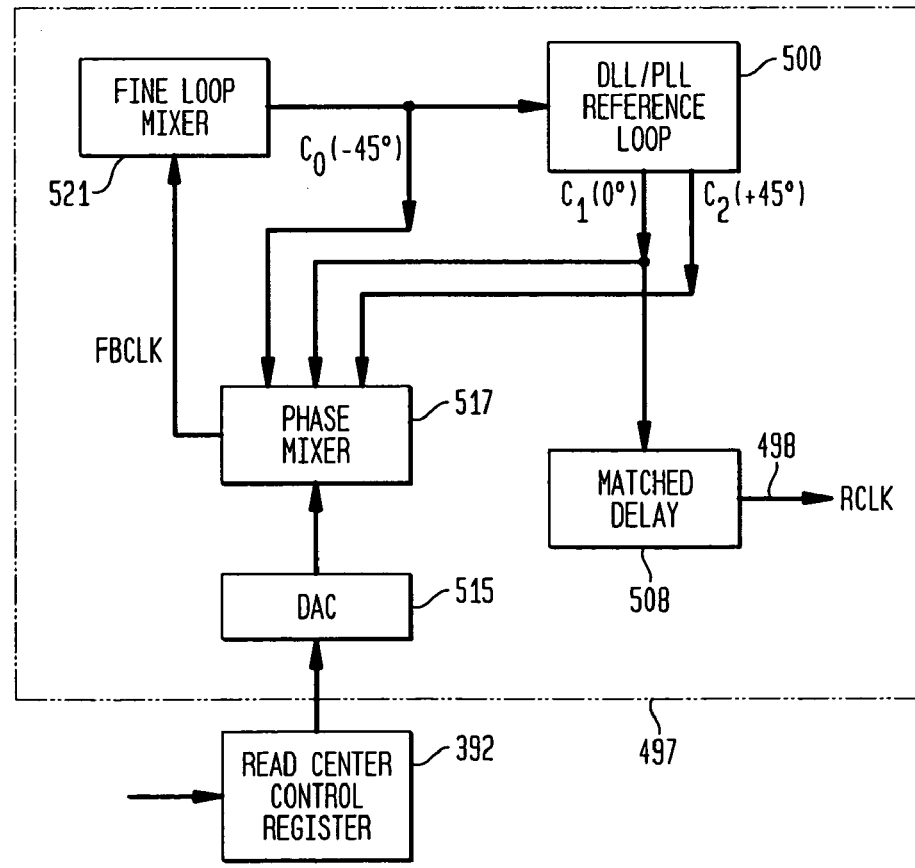
FIG. 15 is schematic diagram of a portion of the embodiment of FIG. 13.

Receiver 382 may receive data from lines 330, buffer the received data, and drive the receive data onto line 384 for internal use. According to a particular embodiment, receiver 382 may also adjust the parameters of the receive data in response to an adjustment signal from processor 54 received at control registers 324. Discussion below with reference to FIGS. 13-15 illustrates this according to a particular embodiment.

Figure 8:
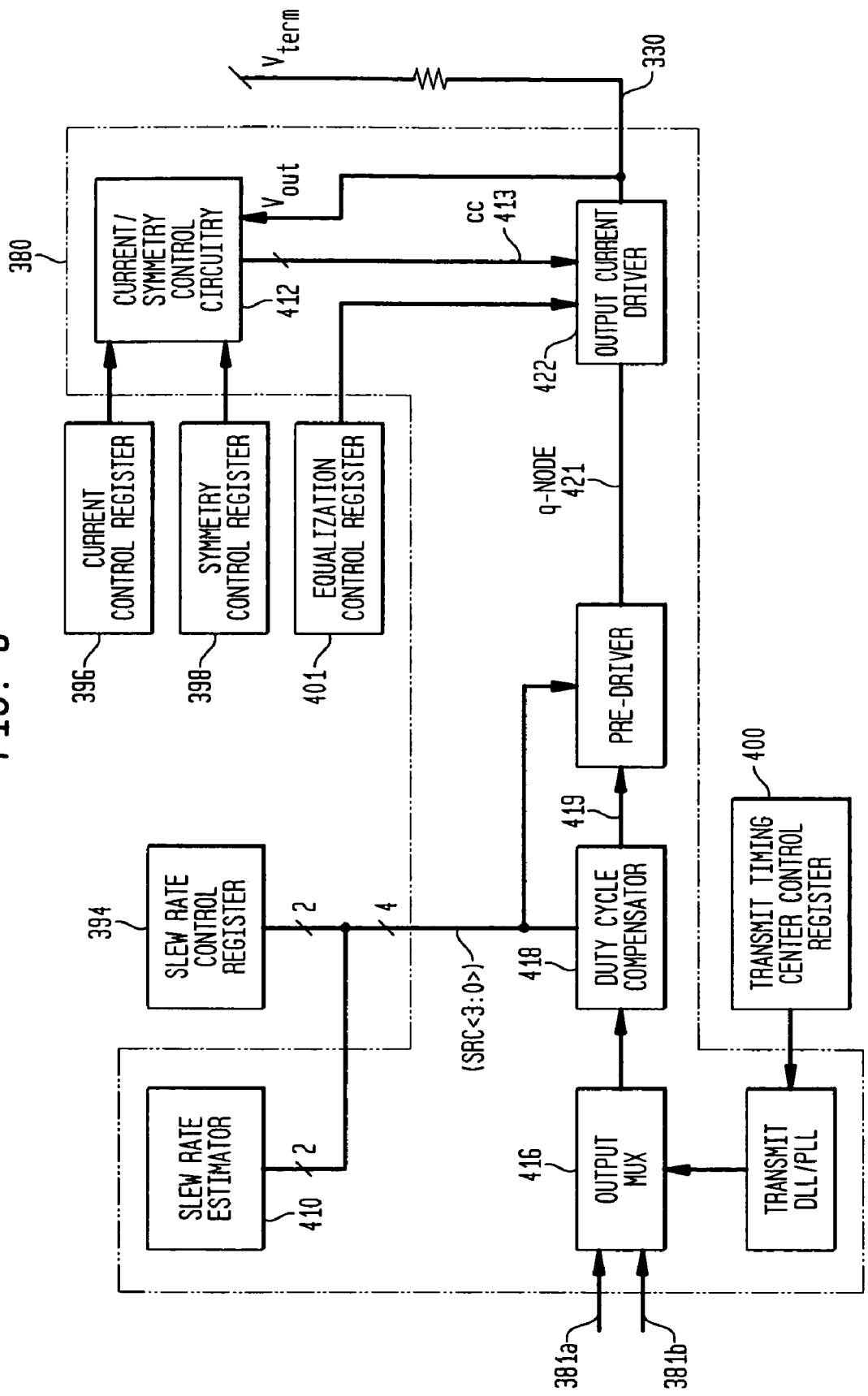
FIG. 8 is a schematic diagram of a portion of the embodiment of FIG. 7.

FIG. 8 is a schematic diagram of transmitter 380 according to a specific embodiment. In this specific embodiment, transmitter 380 may comprise circuitry for adjusting the transmit signal's timing center, slew rate, current swing and symmetry in response to various control signals. Additionally, transmitter 380 may equalize signal characteristics prior to transmission to increase voltage margins. In the illustrated embodiment, transmitter 380 may include a transmit DLL/PLL, output multiplexer (MUX) 416, predriver 420, and output current driver 422. Also included in the illustrated embodiment are duty cycle compensator 418 and slew rate estimator 410. However, it should be understood that these are merely examples of components of an interface and claimed subject matter is not limited in these respects.

The transmit DLL/PLL may generate a transmit clock, which is coupled to output multiplexer 416. The transmit DLL/PLL may adjust the timing of the rising edge of the transmit clock so that the signals transmitted by output current driver 422 will arrive in response to an adjustment signal stored by processor 54 in transmit timing center control register 400. By adjusting the clock signal used to transmit the data signal, transmit timing center control register 400 may vary the time at which the data signal is transmitted so that the data signal will be sampled by a receiving device near a desired position within the data eye, such as, for example, the center of the data eye or a position offset from the center of the data eye. Output multiplexer 416 may receive odd data to be transmitted on line 381a and even data on line 381b and generate clocked data in response to the transmit clock signal from the transmit DLL/PLL. Output multiplexer 416 outputs the clocked data on line 417.

In the illustrated embodiment, there are two sources of slew rate control signals, slew rate estimator 410 and slew rate control register 394. In this embodiment, slew rate estimator 410 may set a baseline slew rate that may be varied in accordance with an adjustment signal provided by processor 54 to slew rate control register 394. Slew rate estimator 410 may generate two signals, SRC<3:2>, here, each representing a single bit of the slew rate control signal. Circuitry for estimating slew rate is well known in the art and will not be described in detail here. The adjustment signal stored in slew rate control register 394 may represent an adjustment to that baseline slew rate. In alternate embodiments, slew rate estimator 410 may be omitted and the slew rate may be controlled via slew rate control register 394.

In the illustrated embodiment, both duty cycle compensator 418 and predriver 420 may be responsive to slew rate control signals. Duty cycle compensator 418 may receive clocked data on line 417, anticipate changes in the duty cycle that may result from predriver 420 in response to the slew rate control signals and pre-compensate for that change in duty cycle. Duty cycle compensator 418 applies its output signal to predriver 420 on line 419. According to a particular embodiment, duty cycle compensator 418 is further described with respect to FIG. 9. In alternative embodiments of transmitter 380, duty cycle compensator 418 may be omitted and the signal on line 417 may be applied directly to Predriver 420. Predriver 420 adjusts the slew rate of the transmit data in response to the slew rate control signals. Predriver 420 applies its output signals to q-node 421. According to a particular embodiment, predriver 420 may be further described with reference to FIG. 10.

Current/symmetry control bits, designated as cc, may be used by output current driver 422 to adjust the voltage swing of the output signals and to adjust the average value of the output signals with respect to $V_{ref}$. According to a particular embodiment, output current driver 422 will be described in detail with respect to FIG. 11. However, claimed subject matter is not limited in this respect. Current/symmetry control circuitry 412 may generate the current/symmetry control bits in response to adjustment signals from processor 54 provided in either current control register 396 or symmetry control register 398. According to a particular embodiment, current/symmetry control circuitry 412 will be described with reference to FIG. 12 below. However, claimed subject matter is not limited in this respect.

Output current driver 422 may use control signals provided by equalization control register 401 to equalize output signals and increase the voltage margins at a receiving device. Based, at least in part, on an adjustment signal from processor 54 stored in equalization control register 401, output current driver 422 may be capable of dynamically changing its drive strength to compensate for residual and cross-coupled signals present on a channel or link. According to a particular embodiment, output current driver 422 capable of equalizing signals is described below with reference to FIGS. 18A and 18B.

Figure 9:
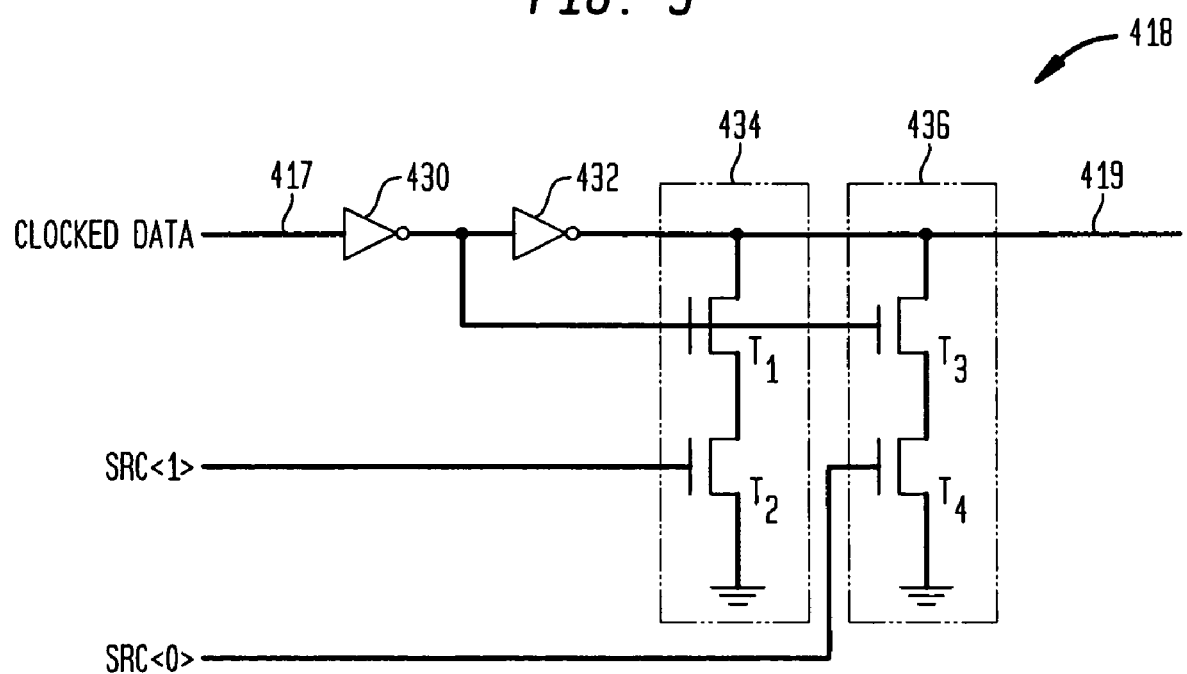
FIG. 9 is a schematic diagram of a portion of the embodiment of FIG. 8.

FIG. 9 is a schematic diagram of a duty cycle compensator according to a particular embodiment of duty cycle compensator 418 of FIG. 8. Here, duty cycle compensator 418 may pre-compensate for distortion of the duty cycle that may results from the slew rate control blocks of predriver 420 if the slew rate control signals SRC<1:0> are enabled. In response to the slew rate control signals, SRC<1:0>, duty cycle compensator 418 may pre-compensate the data signals being applied to predriver 420 such that the distortion that may result from predriver 420 is at least partially offset in the q-node signal at q-node 421. In other words, duty cycle compensator 418 may modify the duty cycle of the clocked data signal on line 417 by a predetermined amount in response to slew rate control signals SRC<1:0>.

Duty cycle compensator 418 comprises a pair of series-connected inverters 430 and 432 and two parallel transistor stacks 434 and 436. Transistor stacks 434 and 436 may comprise respective corresponding n-type transistors connected in series between the output port of inverter 432 and ground. The input signal to upper transistors $T_1$ and $T_3$ is the signal output by Inverter 432. The slew rate control bits are applied to the gate of the lower transistors $T_2$ and $T_4$. A high voltage level on the slew rate control bits enables the stacked transistors to adjust the duty cycle of the clocked data signal, by increasing the slew rate of high-to-low transitions at the input port of predriver 420. A low voltage level on the slew rate control bits disables the stacked transistors and prevents the duty cycle of the clocked data signal on line 419 from being modified. In an alternate embodiment, the lower transistors $T_2$ and $T_4$ may be weighted to provide additional range.

Figure 10:
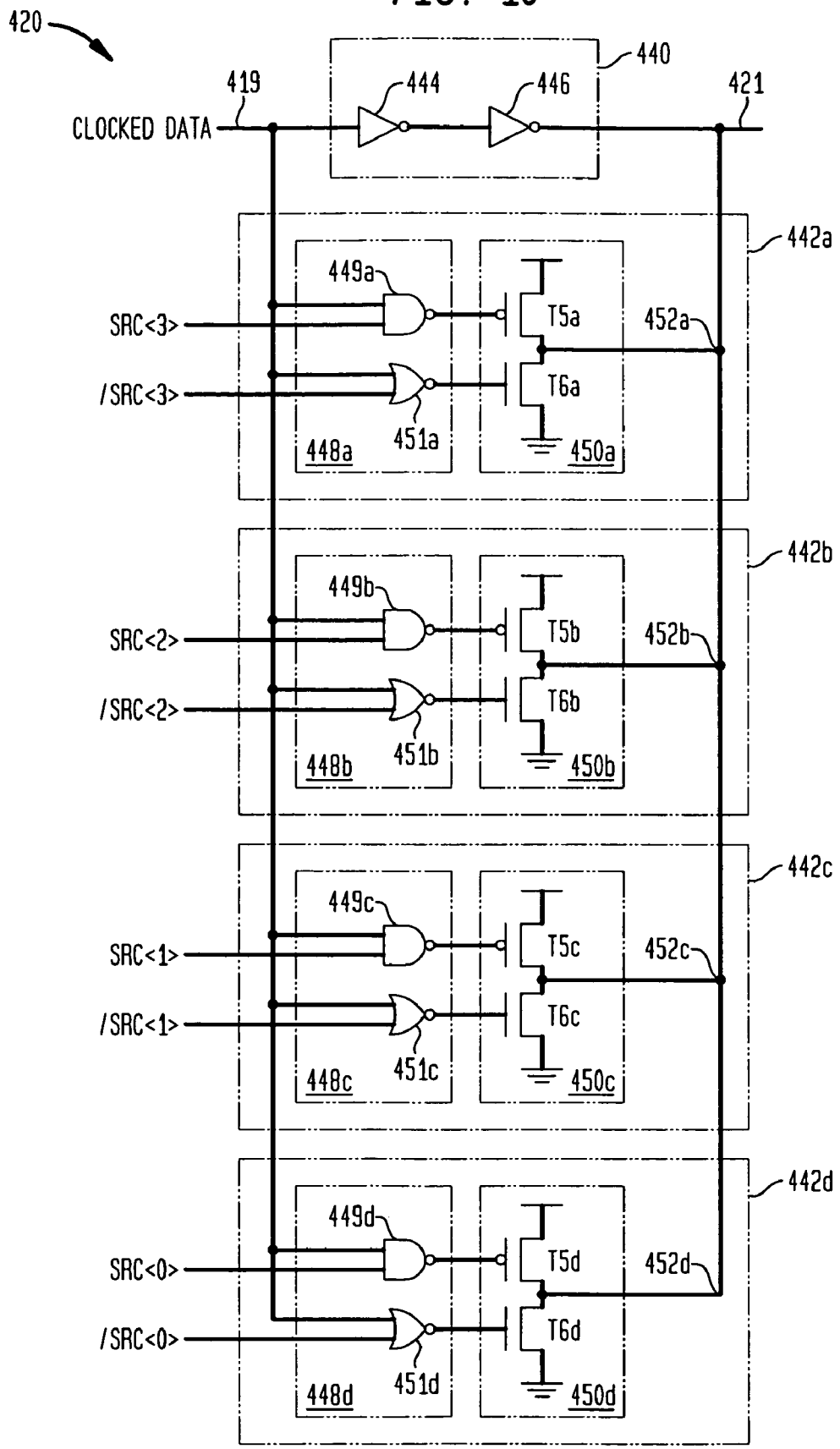
FIG. 10 is a schematic diagram of a portion of the embodiment of FIG. 8.

FIG. 10 is a schematic diagram of a particular embodiment of predriver 420 of FIG. 8. However, this is merely an example embodiment and claimed subject matter is not limited in this respect. Here, predriver 420 comprises base block 440 and slew rate adjustment blocks 442. Predriver 420 may use the slew rate control signals from the slew rate estimator to set a nominal slew rate that it adjusts in response to an adjustment signal provided by processor 54 to slew rate control register 394.

Base block 440 may provide a signal to q-node 421 that has an associated, predetermined slew rate. Base block 440 comprises inverters 444 and 446 connected in series which may be sized to provide both an appropriate slew rate and duty cycle. In the illustrated embodiment, four slew rate adjustments blocks 442a-d are connected in parallel with base block 440, although any arbitrary number may be used and claimed subject matter is not limited in this respect. Slew rate adjustment blocks 442a and 442b may be responsive to slew rate control signals from slew rate estimator 410. Slew rate control blocks 442c and 442d may be responsive to slew rate control signals from slew rate control register 394. The slew rate of the signal on line 421 may increase with the number of enabled slew rate adjustment blocks 442. In one particular embodiment, slew rate adjustment blocks 442 may include a control block 448 connected in series with a stacked transistor pair 450. If enabled by their associated slew rate control signals, control blocks 448 may enable their associated stacked transistor pairs 450 to be responsive to the data signal on line 419. Control blocks 448 comprise a NAND gate 449 and a NOR gate 451. NAND gate 449 may enable the p-channel transistor $T_5$ of stacked transistor pair 450 and NOR gate 451 may enable n-channel transistor $T_6$. The output ports 452 of stacked transistor pairs 450 connect to q-node 421.

If slew rate control bit SRC<x> is at a high voltage level, NAND gate 449 is enabled to be responsive to the data signal on line 419, allowing it to drive transistor $T_5$. If SRC<x> is at a high voltage level, /SRC<x> is at a low voltage level which enables NOR gate 451 to be responsive to the data signal on line 419, allowing the data signal to drive the lower n-channel transistor $T_6$. If the NAND gate 449 and NOR gate 451 are both enabled and if the data signal on line 419 transitions to a low voltage level, a high voltage level appears at the output port of NOR gate 451. This may result in lower n-type transistor $T_6$ conducting current to ground thereby increasing the rate at which the q-node 421 is driven to ground. At substantially the same time that a high voltage level appears at the output port of NOR gate 451, a high voltage level appears at the output port of NAND gate 449 that results in the upper p-channel transistor $T_5$ no longer conducting current and turning off.

If the NAND gate 449 and NOR gate 451 are both enabled and the data signal on line 419 transitions to a high voltage level, a low voltage level appears at the output port of NAND gate 449. This results in the upper p-channel transistor $T_5$ conducting current thereby increasing the rate at which q-node 421 is driven to a high voltage level. At substantially the same time as a low voltage level appears at the output port of NAND gate 449, a low voltage level appears at the output port of NOR gate 451 that results in the lower n-channel transistor $T_6$ turning off. If SRC<x> is at a low voltage level and /SRC<x> is at a high voltage level, neither NAND gate 449 nor NOR gate 451 responds to the data signal and are thereby disabled, preventing a response by stacked transistor pairs 450.

In one embodiment, a slew rate adjustment block 442a may increase the slew rate by 0.5 with respect to base block 440, while the slew rate adjustment block 442b may increase the slew rate by 1.5 with respect to base block 440, etc. However, slew rate adjustment blocks may provide other amounts of adjustment to the slew rate and claimed subject matter is not limited in this respect.

Slew rate adjustment blocks 442 may be sized to provide an appropriate slew rate without regard to the duty cycle to increase the range for settings of the slew rate control bits. Therefore, activating the slew rate adjustment blocks may result in asymmetry in the duty cycle of the output voltage $V_{out}$, for which duty cycle compensator 418 may precompensate, as previously discussed with reference to FIG. 9.

Figure 11:
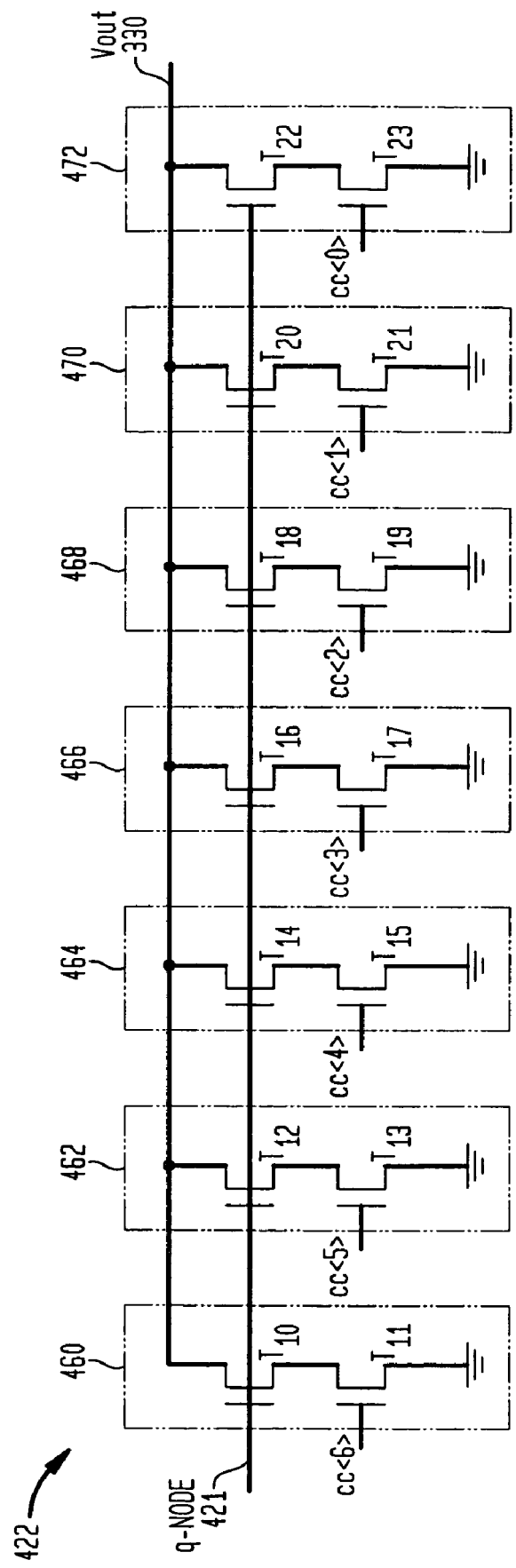
FIG. 11 is a schematic diagram of a portion of the embodiment of FIG. 8.

FIG. 11 is a schematic diagram of output current driver 422, according to a particular embodiment, which may control the voltage swing at the output pins of a transmitter device and the average level of that swing in response to current/symmetry control bits cc. (In the interests of simplicity, FIG. 11 omits circuitry for equalizing the output signal from output current driver 422.) Output current driver 422 comprises multiple transistor stacks 460-472 connected in parallel between DDI 16 and ground. Transistor stacks 460-472 include corresponding pairs of n-channel transistors, an upper transistor and a lower transistor, that are connected in series. The q-node signal on line 421 is applied to the gate of the upper transistors $T_{10}$, $T_{12}$, $T_{14}$, $T_{16}$, $T_{18}$, $T_{20}$ and $T_{22}$. Current/symmetry control signals on a set of current/symmetry control bits, cc<0> through cc<0>, are transmitted to the gate of the lower transistors $T_{11}$, $T_{13}$, $T_{15}$, $T_{17}$, $T_{21}$ and $T_{23}$. If the current/symmetry control signals are at or exceed the threshold voltage ($V_{th}$) of the lower transistor, the corresponding lower transistor $T_{11}$, $T_{13}$, $T_{15}$, $T_{17}$, $T_{21}$ and $T_{23}$ is enabled or "on." If a lower transistor $T_{11}$, $T_{13}$, $T_{15}$, $T_{17}$, $T_{21}$ or $T_{23}$ is enabled and if the q-node signal transitions high (i.e., to its logic high voltage), an amount of current flows through the selected transistor stack to the circuit ground. Therefore, the output drive current is adjusted by setting a subset of the current/symmetry control signals to a high voltage level.

To further provide a programmable output drive current, at least one of the transistor stacks may be binary weighted with respect to other transistor stacks. The transistor pairs in the transistor stacks of the output current driver 422 may be sized so that the current drive capability of transistor stacks 460, 462, 464, 466, 468, 470 and 472 have current drive ratios of 64:32:16:8:4:2:1, respectively (e.g., are binary weighted). However, these are merely examples of weights and claimed subject matter is not limited in this respect.

Figure 12:
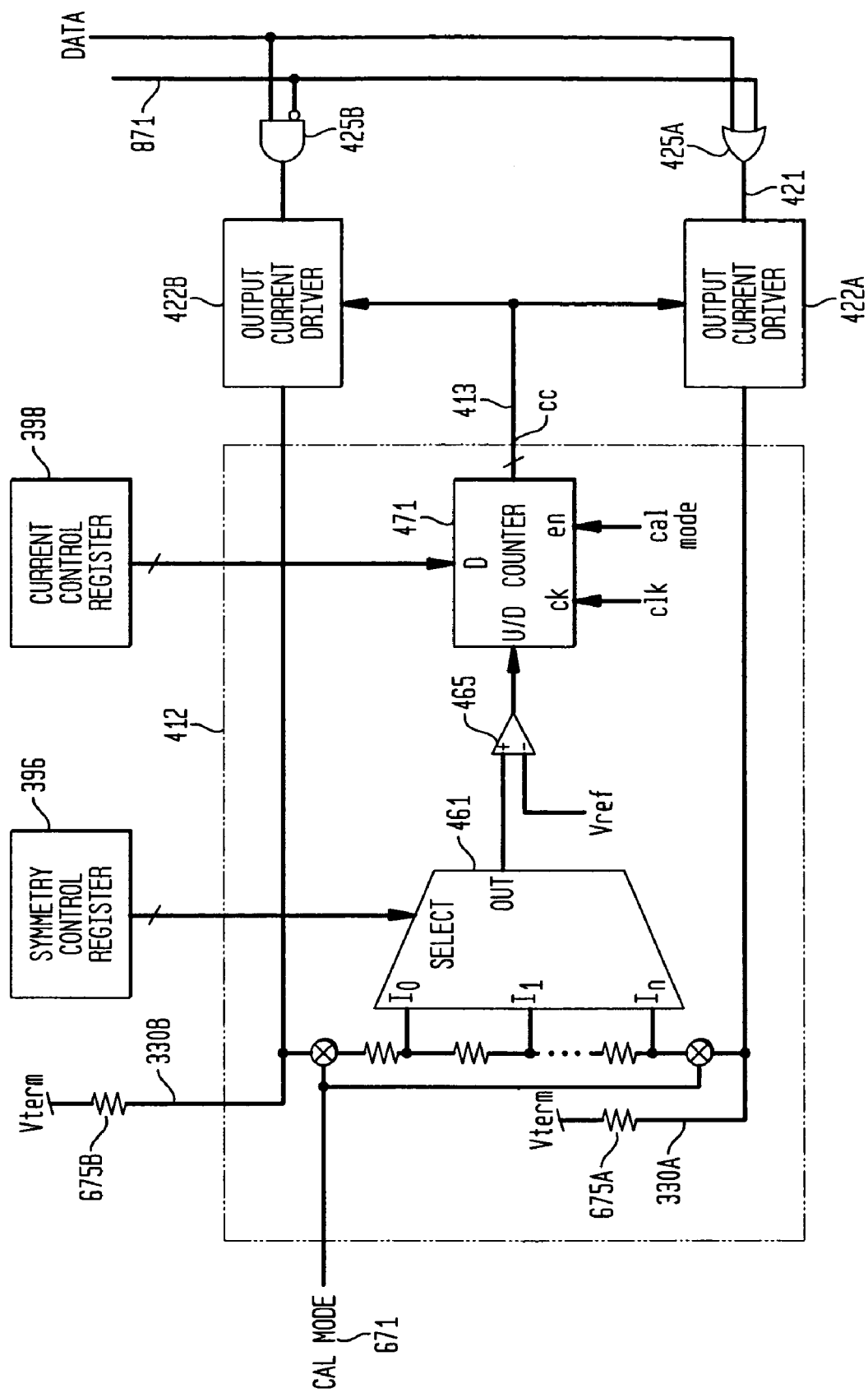
FIG. 12 is a schematic diagram of a portion of the embodiment of FIG. 8.

FIG. 12 is a schematic diagram of current/symmetry control circuitry 412, according to a particular embodiment, which produces current/symmetry control bits cc. However, this is merely an example and claimed subject matter is not limited in this respect. Current/symmetry control circuitry 412 may be used to adjust the average level of signals output by output current driver 422 based, at least in part, upon adjustment signals from processor 54 stored in symmetry control register 396 or to result in output current driver 422 producing full swing output signals based, at least in part, upon adjustment signals from processor 54 stored in current control register 398. Current/symmetry control circuitry comprises a multiplexer (MUX) 461, a comparator 465, and a counter 471, whose count is represented as current/symmetry control bits, cc, on line 413. More specifically, in a particular embodiment, when cal mode signal on line 671 is asserted, switches close to couple a resistor network between lines 330A and 330B. Nodes between the resistors of a resistor network are coupled to respective input ports of MUX 461. The cal mode signal on line 671 also controls logic gates 425A and 425B, which may control output current drivers 422A and 422B. If turned on by gate 425A, output current driver 422A sinks current through resistor 675A, pulling line 330A to a low potential. At approximately the same time, gate 425B turns off output current driver 422B, which leaves line 330B pulled up through resistor 675B. This arrangement may produce a voltage divider between lines 330A and 330B, with successively lower voltage appearing at each input port to MUX 461.

The cal mode signal on line 671 may be controlled by a calibration subsystem that is capable of operating from time-to-time during periods of a calibration mode. According to an embodiment, processor 54 may be capable of activating the calibration subsystem during the calibration mode and/or deactivating the calibration subsystem during other periods. Here, processor may be capable of managing power by deactivating the calibration subsystem during periods other than the calibration mode. However, this is merely an example of how a processor may be employed for facilitating power management in a DDI and claimed subject matter is not limited in this respect.

Current control register 398 may be used to load a value into counter 471, thereby directly controlling the value represented by current/symmetry control bits, cc. In contrast, symmetry control register 396 indirectly controls the current/symmetry control bits. An adjustment signal stored by processor 54 in symmetry control register 396 may be used to select one of the input ports to MUX 461 as its output signal. The input signals to MUX 461 are generated by a series of taps on a resistive voltage divider tied between ground and an output voltage produced by output current driver 422, the $V_{out}$ signal. The signal output by MUX 461 is applied as an input signal to comparator 465. Comparator 465 compares the input signal from MUX 461 to a reference voltage, $V_{ref}$. The output signal from comparator 465 is applied to the up/down input port of counter 471. If the MUX output signal is greater than $V_{ref}$, comparator 465 forces counter 471 to increase its count, and if the MUX output signal is less than $V_{ref}$ then comparator 465 forces counter 471 to decrease its count. Comparator 465 drives its output signal up or down until the $V_{out}$ signal results in the voltage at the selected tap of the resistive divider to substantially equal $V_{ref}$. If this occurs, the current produced by output current driver 422 has reached the desired level indicated by the signal in symmetry control register 396 provided by processor 54. By setting the value of the signal stored in symmetry control register 396 to select one of the different taps of the resistor network, processor 54 may produce an appropriate degree of asymmetry in the output voltage swing. Thus, the adjustment signal stored by processor 54 in symmetry control register 396 may be used to adjust the midpoint between a high output voltage and low output voltage up or down.

Figure 18A:
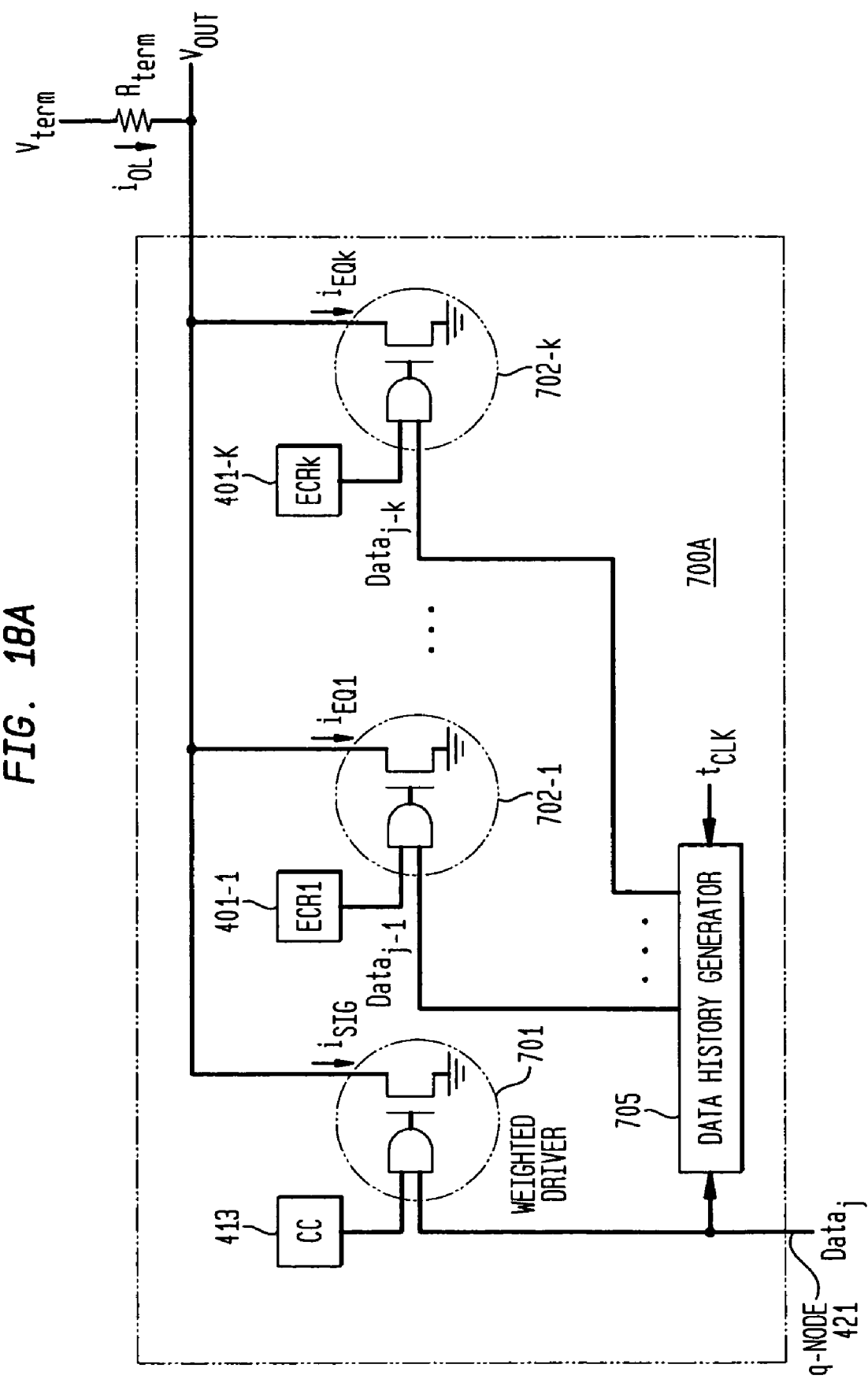
FIGS. 18A and 18B are schematic diagrams of a portion of the embodiment of FIG. 7.

FIG. 18A is a schematic diagram of an output current driver 700A according to a particular embodiment of output current driver 422. However, this is merely an example of an output current driver and claimed subject matter is not limited in these respects. Here, output current driver 700A may dynamically adjust its drive strength to compensate for voltage margins resulting from residual signals on a particular channel. Output current driver 700A may adjust its drive current in response to an adjustment signal stored in equalization control register 401 by processor 54. In other words, output current driver 700A may perform temporal equalization in response to the stored adjustment signal. In the interests of simplicity, FIG. 18A omits circuitry related to current/symmetry control. To accommodate output current driver 700A, equalization control register 401 may be realized as a multiplicity of equalization control registers (ECRs), ECR1 401-1 through ECRk 401-k, storing equalization coefficients, $C_{eq}$. Output current driver 700A may include weighted driver 701, a multiplicity of equalization drivers 702-1 to 702-K, and data history generator 705. Weighted driver 701, which may be implemented using similar circuitry as shown in FIG. 11, may receive a data signal, $Data_j$, from q-node 421 and weight that signal by an amount determined at least in part by the current control cc parameter, as explained above. If turned on by the data signal, $Data_j$, a current $i_{SIG}$ flows through weighted driver 701. In other words, the magnitude of $i_{SIG}$ is a function of $Data_j$ and cc. Data history generator 705 provides input signals to equalization drivers 702 that represent prior data signals, $Data_j-1$ through $Data_j$ j-k. Data history generator 705 may be realized as a shift register. Like weighted driver 701, equalization drivers 702 weight their respective prior data signals by an amount determined by an associated ECR, which stores an equalization coefficient, $c_{eq}$. Thus, equalization drivers 702 respectively sink equalization currents $i_{EQ1}$ through $i_{EQK}$, which may be functions of the prior data signal applied to the individual equalization driver and the adjustment signal from processor 54. The total current, $i_{OL}$, output by output current driver 700A may be expressed as follows:

$$i_{OL}=i_{SIG}+i_{EQ1}+i_{EQ2}\ldots+i_{EQK}+tm \quad (1)$$

Thus, by controlling the magnitude of $i_{OL}$ ECRs 401A-401K+1 enable equalization of $V_{OUT}$ to compensate for residual signals associated with a particular link. That is to say, $V_{OUT}$ may be directly related to $i_{OL}$.

As discussed above with respect to FIG. 11, weighted driver 701 may comprise N binary weighted transistors (e.g., to represent 1x, 2x, . . . $2^{N-1}$x). Thus, the current through weighted driver 701, $i_{SIG}$, may be given by $$i_{SIG}=Data_j \times cc \times I_{UNIT} \quad (2)$$

where:

$I_{UNIT}$ is the current through the smallest weighted transistor ($T_{23}$, FIG. 11) in weighted driver 701 if it is active;

cc is a current control value; and $Data_j$ is the data signal input to weighted driver 701.

Data history generator 705 may receive the signal $Data_j$, transmit clock signal, $t_{CLK}$, and generate K delayed data signals, $Data_{j-1}$, through $Data_{j-k}$. In one embodiment, new data values may be transmitted at rising edges and falling edges of the $t_{CLK}$ signal, while in an alternative embodiment data may be transmitted on one clock edge per cycle of the transmit clock.

Figure 18B:
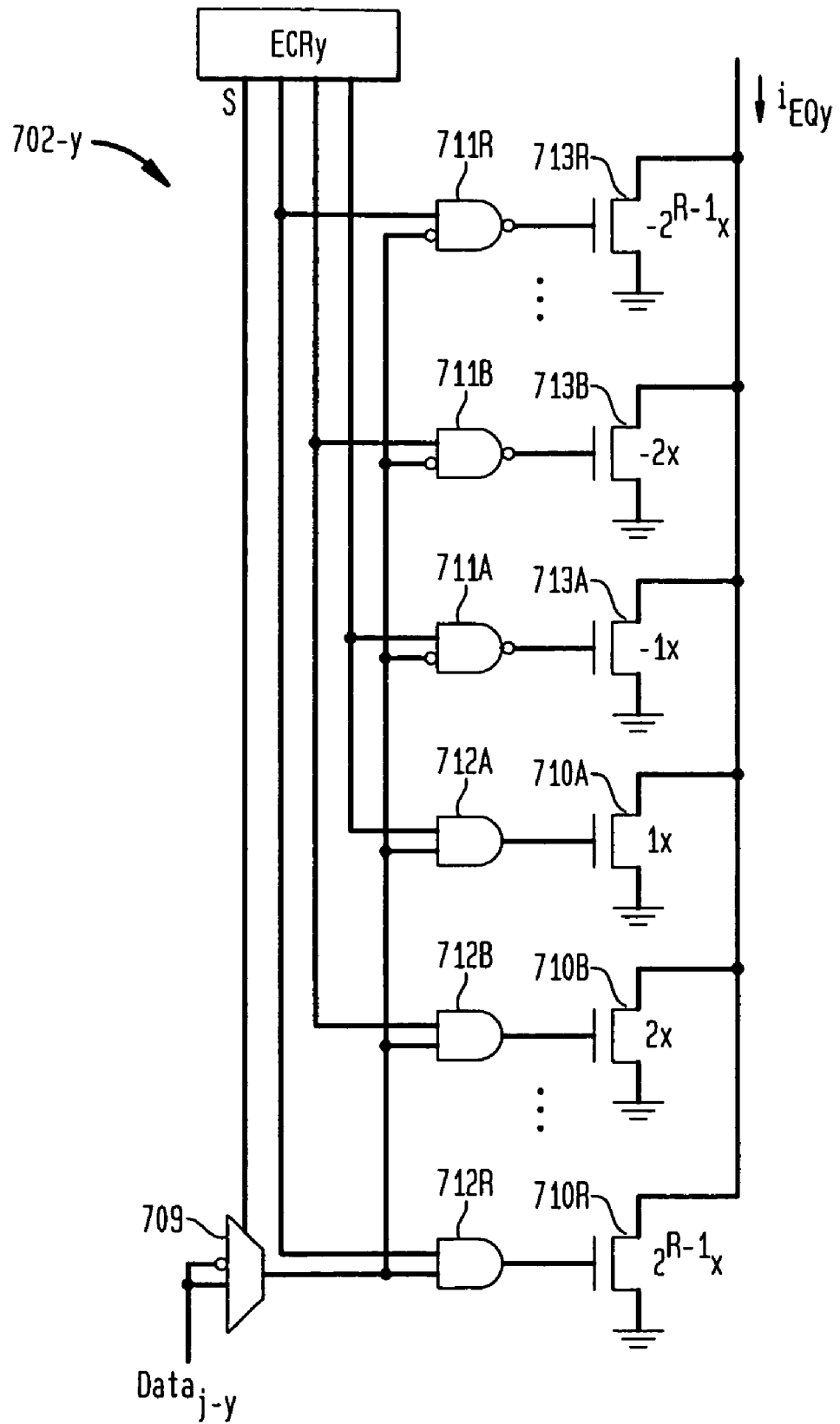

FIG. 18B is a schematic diagram of an equalization driver according to a particular embodiment of the equalization drivers 702-y of FIG. 18A. However, this is merely an example of equalization drivers according to a particular embodiment and claimed subject matter is not limited in this respect. Here, equalization driver 702-y may comprise a multiplexer (MUX) 709, a set of additive logic gates, ADD gates 712A-712R, a set of associated binary weighted transistors 710A-710R, a set of subtractive logic gates, SUB gates 711A-711R, and a set of associated binary weighted transistors 713A-713R. In the illustrated embodiment, ECRs 401A-401K+1 may represent corresponding equalization coefficients via a sign bit (S bit) and multiple magnitude bits. In the illustrated embodiment, the equalization coefficient is represented by three magnitude bits; however, other embodiments including fewer or more magnitude bits are consistent with the claimed subject matter. Referring specifically to the illustrated embodiment of equalization driver 702-y in FIG. 18B, the S bit selects from MUX 709 either the inverted or non-inverted version of the $Data_{j-y}$ signal, while each bit of the coefficient magnitude is applied to an "ADD" AND gate 712 and to a "SUB" AND gate 711. The paired ADD gate 712 and SUB gate 711 associated with a particular magnitude bit each are associated with a similarly weighted binary weighted transistor. In particular, bit 1 of the coefficient magnitude is applied to ADD gate 712A and SUB gate 711A, which, depending on the state of the $Data_{j-y}$ signal, activates transistor 710A (1x) and transistor 713A (−1x), respectively. Note that the binary weighting of transistors 710A and 713A is substantially equal in magnitude, but of opposite sign. Similarly, bit 2 of the coefficient magnitude is applied to ADD G\gate 712B and SUB gate 711B, which may active transistor 710B and transistor 713B, respectively.

According to an embodiment, equalization driver 702-y may operate if the coefficient magnitude bits stored in ECRy 401-y represent zero. In this situation, SUB gates 711A-711R may activate associated binary weighted transistors 713A-713R, while no ADD gates 712A-712R activate associated binary weighted transistors 710A-710R. This may be the case regardless of the state of the $Data_{j-y}$ signal or the state of the S bit from ECR2 401B. Thus, the current sunk by equalization driver 702-y $i_{Eqy}$, is approximately $(2^R-1) \times I_{UNIT}$, where $I_{UNIT}$ is the current through 1x transistor 710A if it is activated.

Next, according to an embodiment, equalization driver 702-y may operate if the equalization coefficient, is at a positive extreme large value, rather than an extreme small value (e.g., coefficient bits are set and the S bit is positive). In this situation, ADD gates 712A-712R may activate associated binary weighted transistors 710A-R and SUB gates 711A-711R may not activate associated binary weighted transistors 713A-R. Thus, the current sunk by equalization driver 702-1, $i_{EQ1}$, may be approximately $(2^{R+1}-2) \times I_{UNIT}$. Finally, according to an embodiment, equalization driver 702-y may operate if the equalization coefficient is at a negative extreme large value (e.g., all the magnitude bits are set and the S bit is negative). If this occurs, ADD gates 712A-712R and SUB gates 711A-711R may be turned off and binary weighted transistors 710A-710R and 713A-713R may not be activated. Thus, in this situation equalization driver 702-$y$ sinks no current. The current sunk by equalization driver 702-$y$ is may be expressed as follows:

$$i_{EQ1}=2^R \times I_{UNIT}+(C_{EQ1} \times 2^R) \times \text{Polarity}(\text{Data}_{j-1}) \times I_{UNIT}; \quad (3)$$

where:

Polarity(Data$_{j-1}$) is 1 if Data$_{j-1}$=1 and −1 if Data$_{j-1}$=0.

Equalization drivers 702-1 to 702-$k$ operate in a similar fashion in response to their associated data signals and equalization coefficients, allowing their output current to be increased or decreased relative to $2^R \times I_{UNIT}$. Thus, the total current $i_{OL}$ output by output current driver 700A may be given by the following expression:

$$I_{OL}=i_{SIG}+i_{EQ} \quad (4)$$

Where:

$$i_{EQ}=2^R \times K \times I_{UNIT}+(c_{EQ1} \times 2^R) \times \text{Polarity}(\text{Data}_{j-1}) \times I_{UNIT}+(c_{EQ1} \times 2^R) \times \text{Polarity}(\text{Data}_{j-2}) \times I_{UNIT}+ \ldots + (c_{EQ1} \times 2^R) \times \text{Polarity}(\text{Data}_{j-K}) \times I_{UNIT}.$$

By setting the term ($2^R \times K \times I_{UNIT}$) equal to the desired high voltage level, $V_{HI}$, on the particular channel, the equalization coefficients, $C_{EQ1}$-$C_{EQK}$, stored in ECRs 401A-401K may be used to effect a current swing above and below the nominal current used to produce $V_{HI}$ and above and below the nominal current used to produce the desired low voltage level, $V_{LO}$. These current swings may be used in turn to overdrive or underdrive the particular channel, compensating the output voltage for past output levels. Note that the current $I_{UNIT}$ drawn by the 1x transistor (T$_{23}$, FIG. 11) associated with weighted driver 701 may be different from the current $I_{UNIT}$ drawn by the 1x transistor 712A associated with equalization driver 702-$y$.

Although FIGS. 18A and 18B illustrate a pull-down circuit for the equalization channel voltage, a combination of pull-up and pull-down circuits may be used in an alternative embodiment. For example, a set of weighted transistors coupled between $V_{TERM}$ and the output port of output current driver 700A may be used to pull up the output signal in proportion to a positive equalization coefficient. Generally, any circuit for adjusting channel voltages may be used without departing from the scope of the claimed subject matter.

In a particular embodiment, the circuitry of FIGS. 18A and 18B may be modified to cross-talk equalize a channel. Cross-talk equalization involves modifying a channel voltage to compensate for cross-coupled signals from neighboring channels. Referring to FIG. 18A, for example, data history generator 705 may be removed and the output signals of neighboring channels may be applied to the input ports of equalization drivers 702-1 to 702-$k$. In this way, equalization currents, $i_{EQ1}$ through $i_{EQK}$, may be generated based, at least in part, upon the state of neighboring channels and weighted, at least in part, according to adjustment signals written to one or more control registers by processor 54. As with temporal equalization, a combination of weighted pull-up and pull-down circuits, differential circuits and/or other circuits for adjusting channel voltages may be used to perform cross-talk equalization. As discussed above, a given device may include both spatial equalization circuitry and temporal equalization circuitry.

Figure 17:
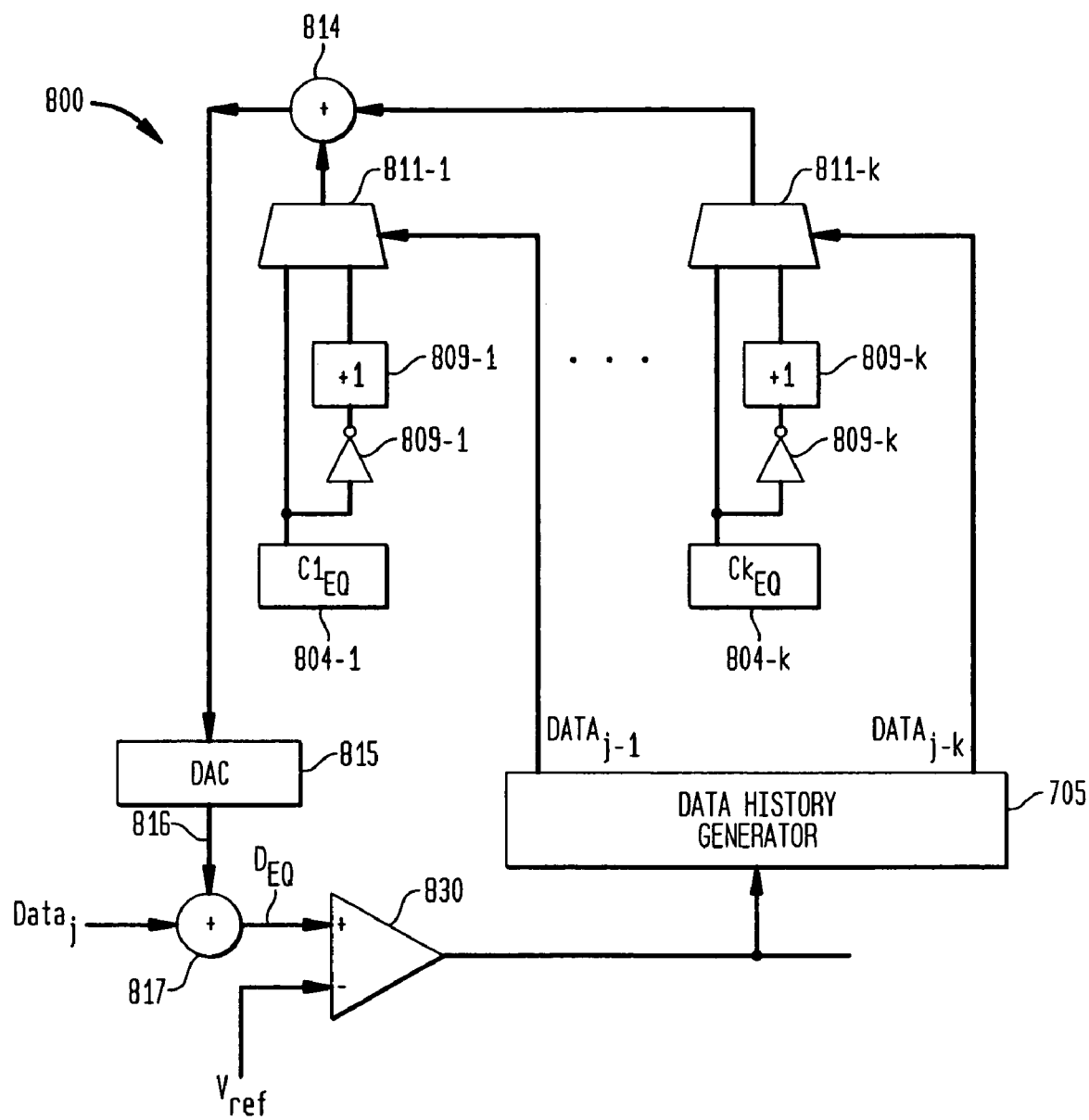
FIG. 17 is a schematic diagram of a portion of the embodiment of FIG. 7.

FIG. 17 illustrates a receiver 800 with equalization circuitry according to one embodiment. Incoming data, Data$_j$, is summed with an equalization offset 816 by analog adder 817, generating an equalized data value $D_{EQ}$ for comparison with $V_{ref}$ by a comparator 830. The equalization offset 816 may be generated by adding and subtracting equalization coefficients C1$_{EQ}$ to CK$_{EQ}$ according to the state of previously received data values, Data$_{j-1}$, to Data$_{j-k}$, respectively.

A data history generator 705 may be implemented as a shift register which receives the output signal of comparator 830 and generates the data history values Data$_{j-1}$, to Data$_{j-k}$. The data history values are used to select, via multiplexers 811-1 to 811-$k$, between positive and negative versions of respective equalization coefficients C1$_{EQ}$ to CK$_{EQ}$ stored in equalization registers 804-1 to 804-$k$. As with the equalization coefficients discussed above with reference to FIG. 18B, equalization coefficients C1$_{EQ}$ to CK$_{EQ}$ may be positive or negative values. As shown in FIG. 17, negative versions of the contents of equalization registers 804 may be generated by respective two's complement generators 809. Any number of circuits for generating negative versions of equalization coefficients may be used in alternate embodiments. Also, one's complement circuitry may be used in alternate embodiments instead of two's complement circuitry.

A digital adding circuit 814 may receive output signals from multiplexers 811-1 to 811-$k$ and generate a sum of coefficients, which it provides to a digital-to-analog converter (DAC) 815. DAC 815 may generate an analog equalization offset value 816 which is summed by analog adder 817 with the incoming data value, Data$_j$.

In an alternate embodiment, separate digital-to-analog converters may be used to convert the output signals of multiplexers 811-1 to 811-$k$ to respective analog values. The analog value or values are then combined with the incoming data value, Data$_j$, by analog adder 817. In this embodiment, adding circuit 814 may be omitted, reducing the amount of time to provide a valid offset value at adder 817. In another alternate embodiment, adder 817 may be used to add the equalization offset to $V_{ref}$ instead of to the incoming data. In that case, the equalization offset is generated with reverse polarity.

In yet another alternate embodiment of a receiver, analog rather than digital circuitry may be used to perform equalization. Sample and hold circuitry may be used to capture past data signals, Data$_{j-1}$ to Data$_{j-k}$. The amplitude of the captured signals are weighted by equalization coefficients C1$_{EQ}$ to CK$_{EQ}$ from registers 804-1 to 804-$k$, and then applied to analog adder 817. Cross-talk equalization may also be accomplished in this manner, except that neighboring signals are weighted by the equalization coefficients instead of prior data signals on the same signal path.

FIG. 13 illustrates, in block diagram form, an embodiment of receiver 382 capable of adjusting two receive signal characteristics, receive timing center and voltage threshold. Receiver 382 includes comparator 480 and timing circuitry 486. Comparator 480 compares the incoming data signals from lines 330 with a reference voltage level, $V_{ref}$, which is adjusted by threshold control circuitry 490. Threshold control circuitry 490 may respond to an adjustment signal from processor 54 stored in threshold control register 390. Threshold control circuitry 490 will be described according to a particular embodiment with respect to FIG. 14.

Timing Circuitry 486 may take the output signal from comparator 480 and synchronize it with the internal receive clock signal, RCLK. Timing circuitry 486 provides the synchronized receive signals to other devices on line 488. Receive delay lock loop/phase locked loop (DLL/PLL) 497 may generate the RCLK signal on line 498 and adjust when the rising edge of the RCLK signal occurs in response to an adjustment signal stored by processor 54 in receive timing center control register 392 so that the received data is sampled near the center of the data eye. Receive DLL/PLL, according to a particular embodiment, will be described with reference to FIG. 15.

FIG. 14 is a schematic diagram of threshold control circuitry 490 and its relationship to threshold control register 390 and comparator 480 according to a particular embodiment. Here, threshold control circuitry 490 may modify the level of $V_{ref}$ from a baseline level in response to the adjustment signal stored in threshold control register 390 by processor 54. The output signal of threshold control circuitry 490 may comprise an adjusted reference voltage, $R_{ead}$, on line 391 which is applied to an input port of comparator 480. Threshold control circuitry 490 comprises a digital-to-analog converter (DAC) 494 and a summing amplifier 496. DAC 494 may produce an analog voltage in response to the digital signal stored in threshold control register 390. DAC 494 applies this analog voltage to summing amplifier 496. Summing amplifier 496 sums this analog voltage from DAC with the system wide reference voltage level, $V_{ref}$, to produce $R_{ead}$, which is applied to comparator 480 on line 391.

FIG. 15 is a schematic diagram of receive DLL/PLL 497, according to a particular embodiment, that takes advantage of signals typically available in DLL/PLL circuits known to those of skill in the art. Receive DLL/PLL 497 may be embodied using other delay lock loop/phase lock loop architectures and claimed subject matter is not limited in this respect. In the illustrated embodiment receive DLL/PLL 497 comprises DLL/PLL reference loop 500, matched delay 508, digital-to-analog converter (DAC) 515, phase mixer 517 and fine loop mixer 521. DLL/PLL reference loop 500 receives a reference clock signal, $C_0$, from fine loop mixer 521. Reference clock signal $C_0$ may be a version of the RCLK signal in a particular embodiment. Given this input value, DLL/PLL reference loop 500 may generate two additional clock signals, $C_1$, and $C_2$. The $C_1$, clock signal may be offset by 45 degrees from the $C_0$ signal, and is thus in phase with RCLK, while the $C_2$ signal may be offset by 90 degrees from the $C_0$ signal. The three clock signals $C_0$, $C_1$ and $C_2$ may be coupled to phase mixer 517, which generates an offset feedback signal, FBCLK, which may vary between −45 degrees and 45 degrees offset from RCLK. The amount of offset of the FBCLK signal may be determined, at least in part, by the adjustment signal stored in receive timing center control register 392 by processor 54. DAC 515 may produce an analog voltage representative of the desired timing offset in response to the output signal from receive timing center control register 392. DAC 515 may apply its output voltage to phase mixer 517. The $C_1$ clock signal is provided through matched delay 508 as the RCLK signal.

Figure 16:
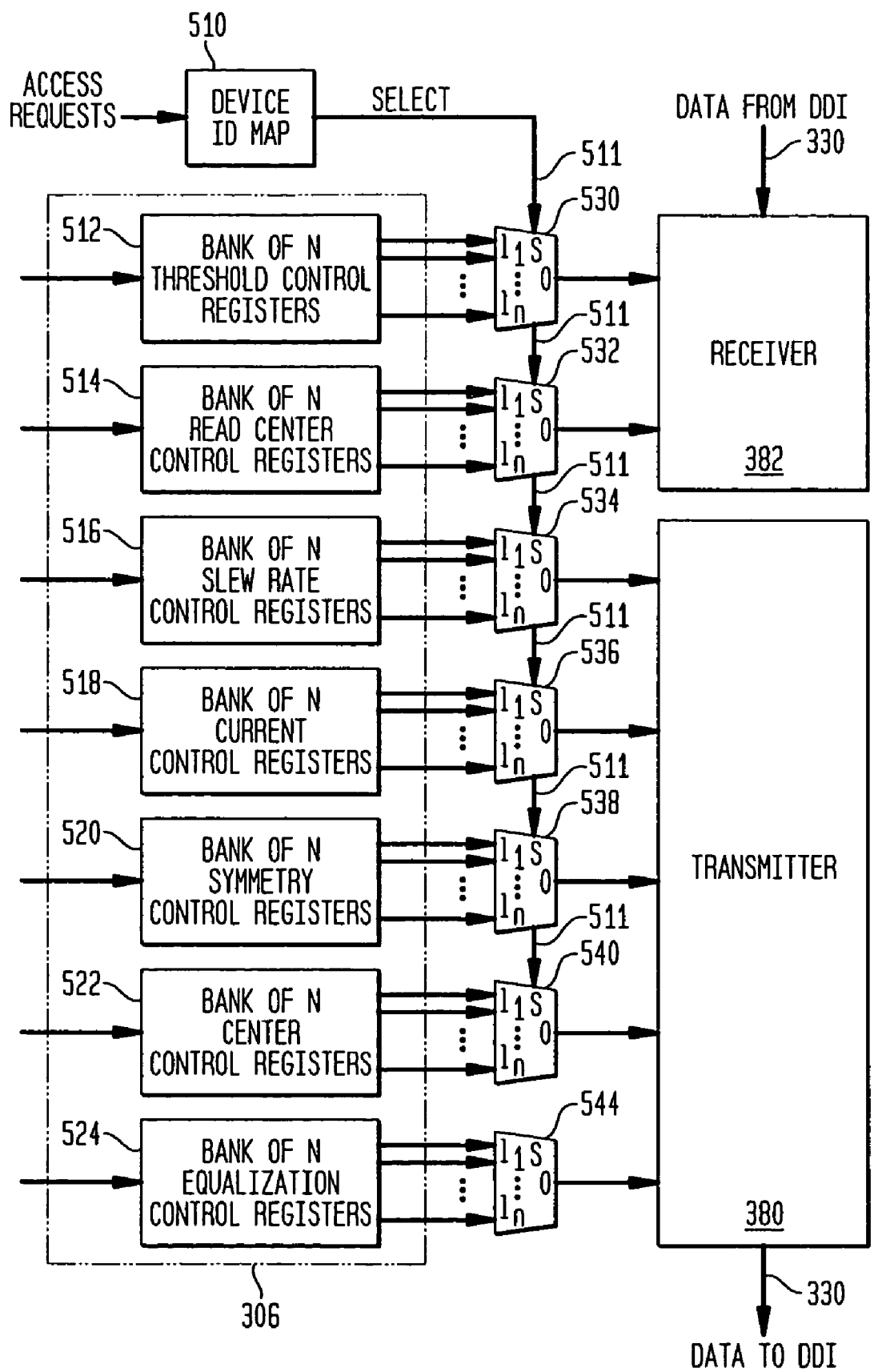
FIG. 16 is a schematic diagram of an alternate embodiment of an interface device.

FIG. 16 is a schematic diagram of an interface, according to a particular embodiment of interface 322 which is capable of adjusting one or more of several receive and/or transmit signal characteristics. The interface comprises circuitry that enables alteration of receive and/or transmit signal characteristics for use in, for example, multi-drop or point-to-multipoint DDI systems. In such multi-device systems, the receive and/or transmit characteristics may be adjusted depending on a particular device that is transmitting or receiving data. The interface may comprise receiver 382, transmitter 380, multiplexers (MUX's) 530-540 and device ID map 510. Map 510 may select one of N control registers in each of several banks of control registers 512-522 based on an address or other identifier in each access request.

Control registers 306 may comprise several banks of control registers 512-522. Multiple banks of control registers may be used for corresponding multiple signal characteristics to be adjusted in response to adjustment signals stored in the control registers by processor 54. According to an embodiment, a bank of control registers 512-522 may comprise N control registers, where N may represent the number of links and/or channels which are to be controlled by processor 54 based, at least in part, on interface voltage and/or timing comparison signals. Thus, bank of control registers 512 may comprise N threshold control registers to store N corresponding adjustment signals from processor 54. The threshold control registers may store adjustment signals similar to those discussed previously with reference to threshold control register 390. Bank 514 may comprise N receive timing center control registers to store similar types of adjustment signals from processor 54 discussed previously with respect to receive timing center control register 392. Bank 516 may comprise N slew rate control registers storing for corresponding channels and/or links similar types of adjustment signals previously discussed with respect to slew rate control register 394. Bank 518 may comprise N current control registers to store similar types of adjustment signals from processor 54 as previously discussed with respect to current control register 396. N symmetry control registers comprising bank 520 may store similar types of adjustment signals from processor 54 discussed previously with respect to symmetry control register 398. Similarly, bank 522 comprises N transmit timing center control registers to store similar types of adjustment signals from processor 54 as previously discussed with respect to transmit timing center control register 400. Bank 524, coupled to MUX 544, comprises N equalization control registers to store similar types of equalization coefficients discussed previously with respect to equalization control register 401.

In alternate embodiments, control registers 324 may comprise one of each type of control register bank per channel of lines 330. These embodiments contrast with the embodiment illustrated in FIG. 16, which includes one bank of each type of control register. Associated with banks of control registers 512-522 are corresponding MUX's 530, 532, 534, 536, 538 or 540 for selecting adjustment signals associated with control registers of the bank. The adjust signals selected from the bank are then applied to either receiver 382 or transmitter 380. For example, MUX 530 may apply an adjustment signal from a threshold control register of bank of control registers 512 to receiver 382 while MUX 538 may apply an adjustment signal from a single symmetry control register of bank 520 to transmitter 380. MUX's 530-540 may select which input signal is to be generated in response to a device ID signal on line 511 generated by device ID Map 510. In one embodiment, for example, device ID map 510 may analyze memory requests received and identify a particular device with which data should be exchanged. Device ID Map 510 may be realized as a memory device storing a table mapping system addresses to device IDs.

Referring now to FIGS. 19-23, Single-Instruction Multiple-Data (SIMD) embodiments will be described. In a SIMD embodiment, processing of data at multiple interface control circuits is distributed among an instruction sequencer and a multiple of processing elements, each processing element being associated with a respective interface control circuit.

Figure 19:
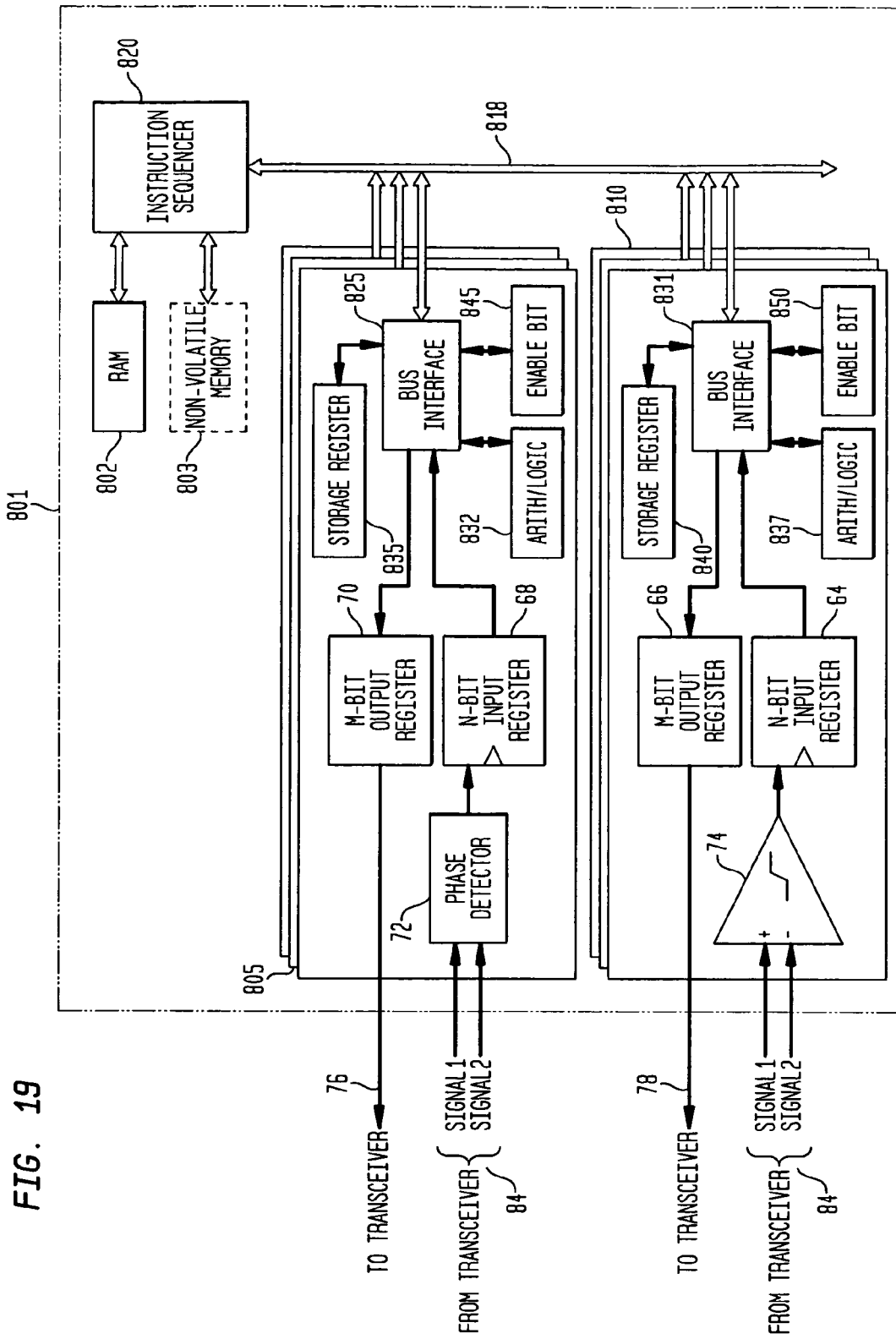
FIG. 19 is a schematic diagram of an embodiment of a system to control interface timing and/or voltage operations for signals transmitted via a DDI.

FIG. 19 is a schematic diagram of an embodiment of circuitry to at least in part control interface timing and/or voltage operations for processing of signals transmitted and/or received via a DDI, such as for the system shown in FIG. 1. In FIG. 19, a system 801 comprises multiple interface timing control circuits 805 and multiple interface voltage control circuits 810. The interface timing control circuits and interface voltage control circuits may be associated with corresponding multiple links of a DDI. Corresponding signals may be associated with and/or used in voltage and/or timing operations. For example, a particular interface timing control circuit 805 may generate an interface timing comparison signal based, at least in part, on a signal 84 received from a corresponding link of the DDI.

According to an embodiment, a bus 818 couples an instruction sequencer 820 to multiple bus interfaces 825 with multiple corresponding interface timing control circuits 805, and to multiple bus interfaces 831 with multiple corresponding interface voltage control circuits 810. The interface timing control circuits respectively include processing elements 832, and the interface voltage control circuits respectively include processing elements 837. The processing elements 832 and 837 are responsive to instruction sequencer 820. That is, the processing elements 832 and 837 receive instruction opcodes and/or constants from the instruction sequencer and carry out operations on data in accordance with the received instruction opcodes and/or constants. The instruction sequencer may be optionally coupled to a RAM 802 and/or a non-volatile memory 803. In a preferred embodiment, the RAM and non-volatile memory are used for storing opcodes and/or constants. According to an embodiment, sequencer 820, RAM 802, and non-volatile memory 803 may be formed on a single semiconductor die. In an alternative embodiment, RAM 802 and memory 803 may be located on devices separate from sequencer 820 and interface control circuits 805 and 810.

It should be noted that in this description the term "opcode" denotes a code specifying one or more operations that can be performed by one or more processing elements. However, the SIMD embodiments are not limited to such codes. Indeed, the SIMD embodiments may be implemented with any communication scheme that serves to convey information regarding one or more operations that can be performed by one or more processing elements.

Referring back to FIG. 19, the multiple bus interfaces 825 may receive interface timing comparison signals from corresponding registers 68. The interface timing comparison signals are generated by phase detectors 72, each phase detector comparing two signals received from a transceiver that corresponds to the phase detector. Once the comparison signals have been generated and stored in registers 68, the bus interfaces may transmit the received comparison signals to associated storage registers 835. However, claimed subject matter is not limited in scope to this example embodiment.

In a particular embodiment, processing elements 832 may execute one or more processes to determine multiple interface timing adjustment signals based, at least in part, on corresponding multiple interface timing comparison signals stored in storage registers 835 and an instruction opcode and constant transmitted by instruction sequencer 820. In one possible processing sequence of such embodiment, a first opcode and first constant are broadcast to the processing elements 832 by the instruction sequencer 820 through bus interfaces 825. Upon reception of the first opcode and first constant, each of processing elements 832 compares the interface timing comparison signal stored in its corresponding storage register 835 with the first constant to generate a result indicative of the difference between the interface timing comparison signal and the first constant. A second opcode and second constant is broadcast by the instruction sequencer to cause the processing elements 832 to transmit the result of the comparison to M-Bit output registers 70 (through bus interfaces 825) if the magnitude of the difference between the interface timing comparison signal and the first constant is greater than the second constant. The values stored in the M-Bit output registers 70 are, in turn, used to generate multiple interface timing adjustment signals 76. The multiple interface timing adjustment signals 76 may then be employed in adjustment of one or more timing characteristics of signal 84, for example, in a closed feedback loop.

In this manner, timing adjustment signals 76 are conditionally generated for the multiple of interface timing control circuits in the time required to execute the first and second opcodes. Further, since the opcodes are broadcast to the interface timing control circuits and executed in parallel by the processing elements of the circuits, the amount of time it takes to conditionally generate timing adjustment signals is independent of the number of timing control circuits coupled to bus 818. By contrast, if a processor coupled to bus 818 had to perform the instructions of the first and second opcodes in a serial fashion for "N" timing circuits, the time required to conditionally generate timing adjustment signals would be approximately equal to N times the time required in the FIG. 19 system.

It should be noted that the SIMD embodiments are not limited to the opcode scheme discussed in connection with the generation of timing adjustment signals 76, and that the opcodes discussed in connection with the generation of timing adjustment signals 76 are presented for purposes of illustration only. Upon reviewing this description, one skilled in the art of SIMD will appreciate that many alternative opcodes and/or opcode schemes may be used with the SIMD embodiments.

In any event, the operation of the interface voltage control circuits of FIG. 19 is similar to the operation of the interface timing control circuits of FIG. 19. The multiple bus interfaces 831 may receive interface voltage comparison signals from corresponding registers 64. The interface voltage comparison signals are generated by voltage comparators 74, each comparator comparing two signals received from a transceiver that corresponds to the comparator. Once the comparison signals have been generated and stored in registers 64, the bus interfaces may transmit the received comparison signals to associated storage registers 840. However, claimed subject matter is not limited in scope to this example embodiment.

In a particular embodiment, processing elements 837 may execute one or more processes to determine multiple interface voltage adjustment signals based, at least in part, on corresponding multiple interface voltage comparison signals stored in storage registers 840 and an instruction opcode and constant transmitted by instruction sequencer 820. In one possible processing sequence of such embodiment, a first opcode and first constant are broadcast to the processing elements 837 by the instruction sequencer 820 through bus interfaces 831. Upon reception of the first opcode and first constant, each of processing elements 837 compares the interface voltage comparison signal stored in its corresponding storage register 840 with the first constant to generate a result indicative of the difference between the interface voltage comparison signal and the first constant. A second opcode and second constant is broadcast by the instruction sequencer to cause the processing elements 832 to transmit the result of the comparison to M-Bit output registers 66 (through bus interfaces 831) if the magnitude of the difference between the interface voltage comparison signal and the first constant is greater than the second constant. The values stored in the M-Bit output registers 66 are, in turn, used to generate multiple interface voltage adjustment signals 78. The multiple interface voltage adjustment signals 78 may then be employed in adjustment of one or more voltage characteristics of signal 84, for example, in a closed feedback loop.

In this manner, voltage adjustment signals 78 are conditionally generated for the multiple of interface voltage control circuits in the time required to execute the first and second opcodes. Thus, the processing-time advantages realized in connection with the generation of the voltage adjustment signals are the same as the processing-time advantage realized in connection with the generation of the timing adjustment signals.

It should be noted that, as in the case of generating the timing adjustment signals, the SIMD embodiments are not limited to any particular opcode scheme for generating the voltage adjustment signals 78, and that the opcodes discussed in connection with generating the voltage adjustment signals 78 are presented for purposes of illustration only. Upon reviewing this description, one skilled in the art of SIMD will appreciate that many alternative opcodes and/or opcode schemes may be used with the SIMD embodiments.

Moreover, it is noted that one or more of the interface timing control circuits and/or one or more of the interface voltage control circuits of the FIG. 19 embodiment may be associated with an enable bit. For purposes of illustration, an embodiment will be described in which each of the interface timing control circuits and interface voltage control circuits employs an enable bit.

Referring to FIG. 19, the interface timing control circuits 805 employ enable bits 845, and the interface voltage control circuits employ enable bits 850. The enable bits may be stored in dedicated registers (as shown in FIG. 19), or may be stored at some other location, such as the storage registers 835 and 840. If the enable bit of a control circuit is set to a predetermined level, then the processing element of that circuit will respond to opcodes received from the instruction sequencer, if the enable bit of a control circuit is not at the predetermined level, then the processing element of the circuit will not respond to opcodes received from the instruction sequencer. For instance, if enable bits 845 associated with interface timing control circuits 805 are set to a value of "1" (i.e. set to a "high" logic level), then the processing elements 832 will respond to opcodes received from the instruction sequencer 820, and if enable bits 850 associated with interface voltage control circuits 810 are set to a value of "0" (e.g. set to a "low" logic level), then the processing elements 837 will not respond to opcodes received from the instruction sequencer 820. Thus, each processing element is enabled or disabled according to the state of its respective enable bit. In this manner, the generation of adjustment signals may respectively conditioned on the states of the enable bits.

The enable bit feature can be used to implement an "if-then-else" function. That is, one or more opcodes could specify a conditional setting of the enable bit of an interface control circuit to a predetermined level such that the circuit's processing elements would then respond to future opcodes only if the condition for setting the enable bit to the predetermined level was met. For example, a first opcode, or series of opcodes, and a constant could be broadcast to the interface timing control circuits 805 which causes the processing elements 832 to compare a data value in storage registers 835 to the constant and to set the enable bits 845 to a logic level "1" if the data value is greater than the constant. For those cases in which the value is greater than the constant, the enable bit is set to "1" and the corresponding processing elements are responsive to future opcodes. In those cases in which the value is not greater than the constant, the enable bit is set to "0" and the corresponding processing elements are not responsive to future opcodes. Thus, "if" the data value exceeds the constant, "then" the corresponding processing element executes the following instructions, "else" the corresponding processing element does not execute the following instructions. Notably, the state of the enable bits can be reset by a subsequent opcode or opcodes.

Regardless of whether or not an enable bit feature is employed in the FIG. 19 embodiment, the instruction sequencer and processing elements of FIG. 19 may be collectively applied to perform operations such as those performed by processor 54 of FIG. 2A. For instance, the instruction sequencer 820 and processing elements 832 and 837 may be used for controlling interface voltage and/or timing characteristics of signals 84 in the aforementioned closed feedback fashion during the start-up mode to account for particular physical characteristics of loops being controlled. In another embodiment, the instruction sequencer and processing elements may continue controlling the interface voltage and/or timing characteristics of signals 84 during the operational mode while signals transmitted via DDI 16 (e.g., signals for a memory interface or signal packets and/or frames formatted according to a communication protocol). However, it is important to note that the instruction sequencer and processing elements are not limited to the performing functions such as those performed by processor 54.

Further, it should be noted that in each of the applications to which the instruction sequencer and processing elements are applied, one or more of storage registers 835 and/or 840 may or may not be employed. Thus, in alternative embodiments, one or more of storage registers 835 and/or 840 may be omitted.

Figure 20:
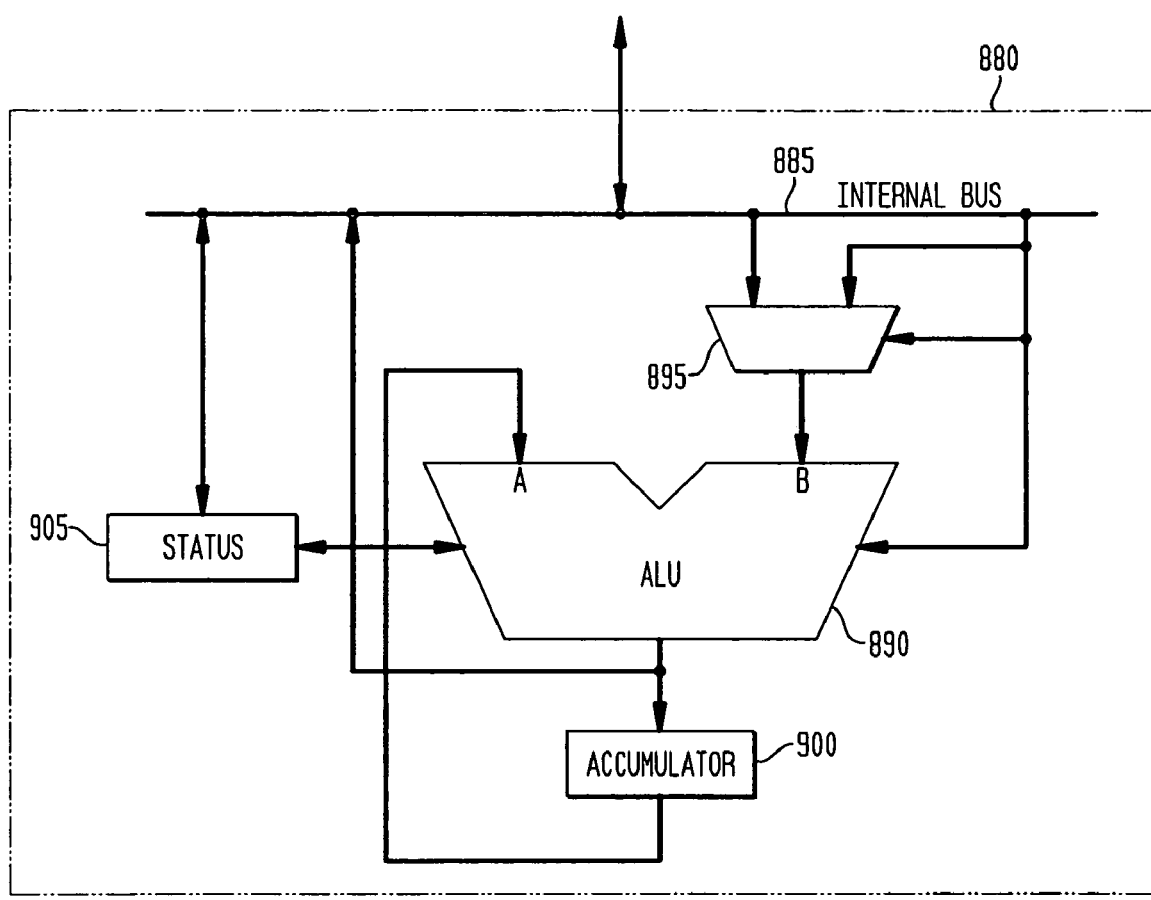
FIG. 20 is a schematic diagram of a preferred embodiment of a processing element such as one of the processing elements depicted in FIG. 19.

Referring now to FIG. 20, there is shown a schematic diagram of a preferred embodiment of a processing element 880. A multiple of the FIG. 20 processing elements may be used, for example, as the processing elements 832 and 837 of FIG. 19. As shown in FIG. 20, the processing element includes an internal bus 885, an arithmetic logic unit (ALU) 890, a multiplexer 895, an accumulator 900 and a status register 905. Here, the internal bus 885 includes separate opcode and data buses that are used to carry opcodes and data, respectively. In an alternative embodiment, internal bus 885 may comprise a time multiplexed bus to carry both opcodes and data at different times. In either case, an opcode received from an instruction sequencer is used to control the operations of ALU 890, multiplexer 895 and accumulator 900. For example, if an opcode indicates that data at a storage register location is to be retrieved, the data at the location is accessed and stored within accumulator 900 via multiplexer 895 and ALU 890. If an opcode indicates that an arithmetic or logical operation is to be carried out using the contents of accumulator 900, then multiplexer 895 is controlled to select the source of a second operand, if any, and ALU 890 is controlled to perform the operation. For example, if the second operand is being fetched from a storage register or is sourced by status register 905 or ALU 890 itself, the second operand is driven onto internal bus 885 and passed to the 'B' input port of the ALU via multiplexer 895. The contents of accumulator 900 may be supplied to the 'A' input port of ALU 890 so that the specified arithmetic or logical operation may be carried out on the operands supplied to the 'A' and 'B' input ports of ALU 890, with the result being re-loaded into accumulator 900 and/or passed to internal bus 885. The result of a given logical or arithmetic operation within ALU 890 may result in one or more flags being set within the status register (e.g., overflow, underflow, zero, error, etc.), with such flags being supplied to other circuit blocks within the processing element via internal bus 885 or other signal paths (not shown).

Having described the preferred embodiment of FIGS. 19 and 20 in detail, the embodiments of FIGS. 21 and 22 will be described and will be readily appreciated in view of the description of FIGS. 19 and 20 in combination with the description of FIGS. 3 and 4.

Figure 21:
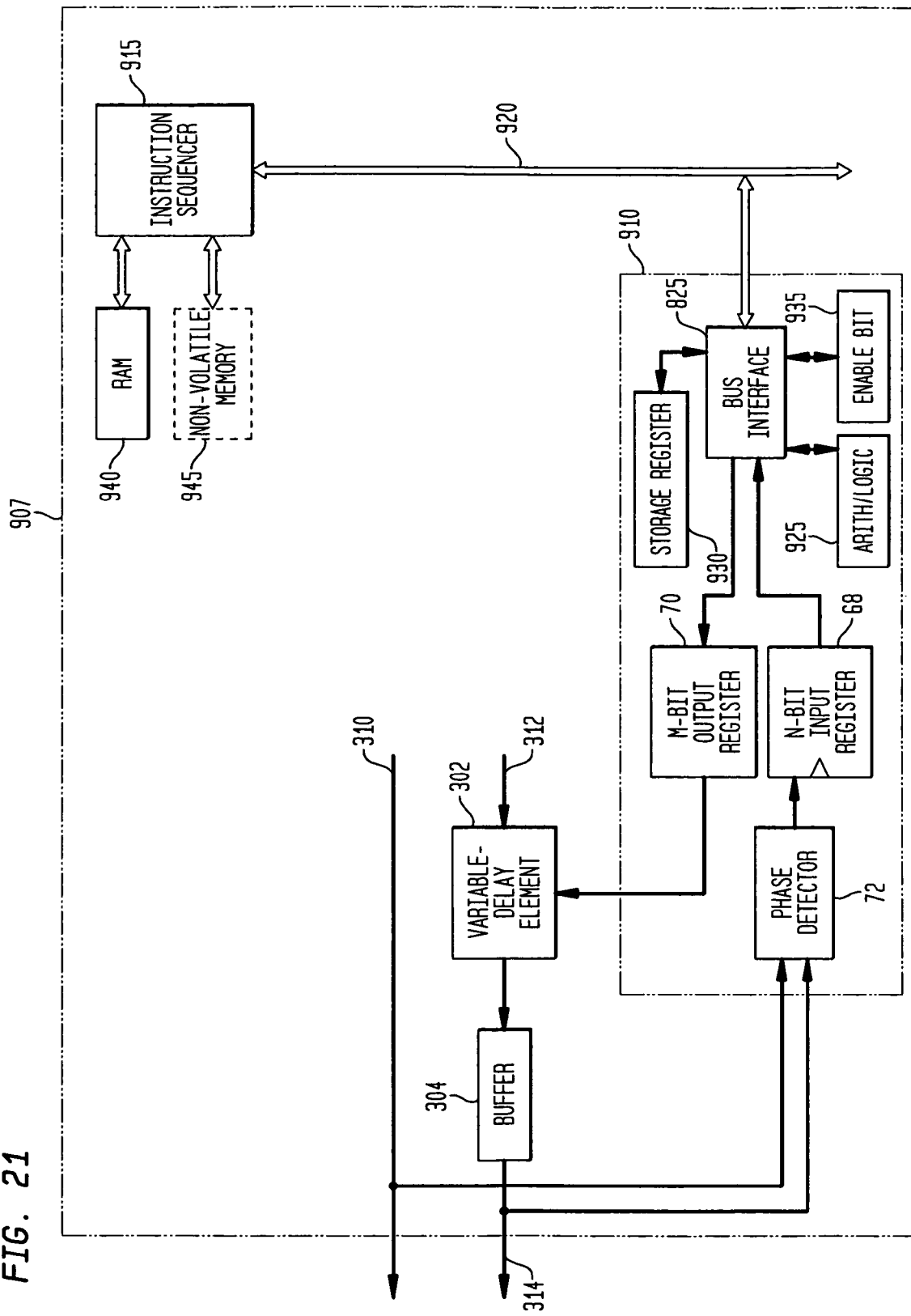
FIG. 21 is a schematic diagram of an embodiment of a system to control interface timing operations for signals transmitted via a DDI.

FIG. 21 is a schematic diagram of an embodiment 907 of a system to at least in part control interface timing operations. For simplicity, FIG. 21 shows a single timing control circuit 910 coupled to an instruction sequencer 915 through bus 920 for the purpose of illustrating control of timing operations for a single link of a DDI. However, it should be apparent that, as illustrated in FIG. 19, system 907 may comprise multiple interface timing control circuits 910 coupled to sequencer 915 through bus 920 which correspond with multiple links of the DDI.

In a preferred embodiment, the system of FIG. 21 operates like the system of FIG. 3 with the exception that the functions carried out by the combination of FIG. 3's processor 54, RAM 80, memory 82, and bus 52 are carried out by the combination of FIG. 21's instruction sequencer 915, processing element 925, storage register 930, enable bit 935, RAM 940, non-volatile memory 945, and bus 920.

Figure 22:
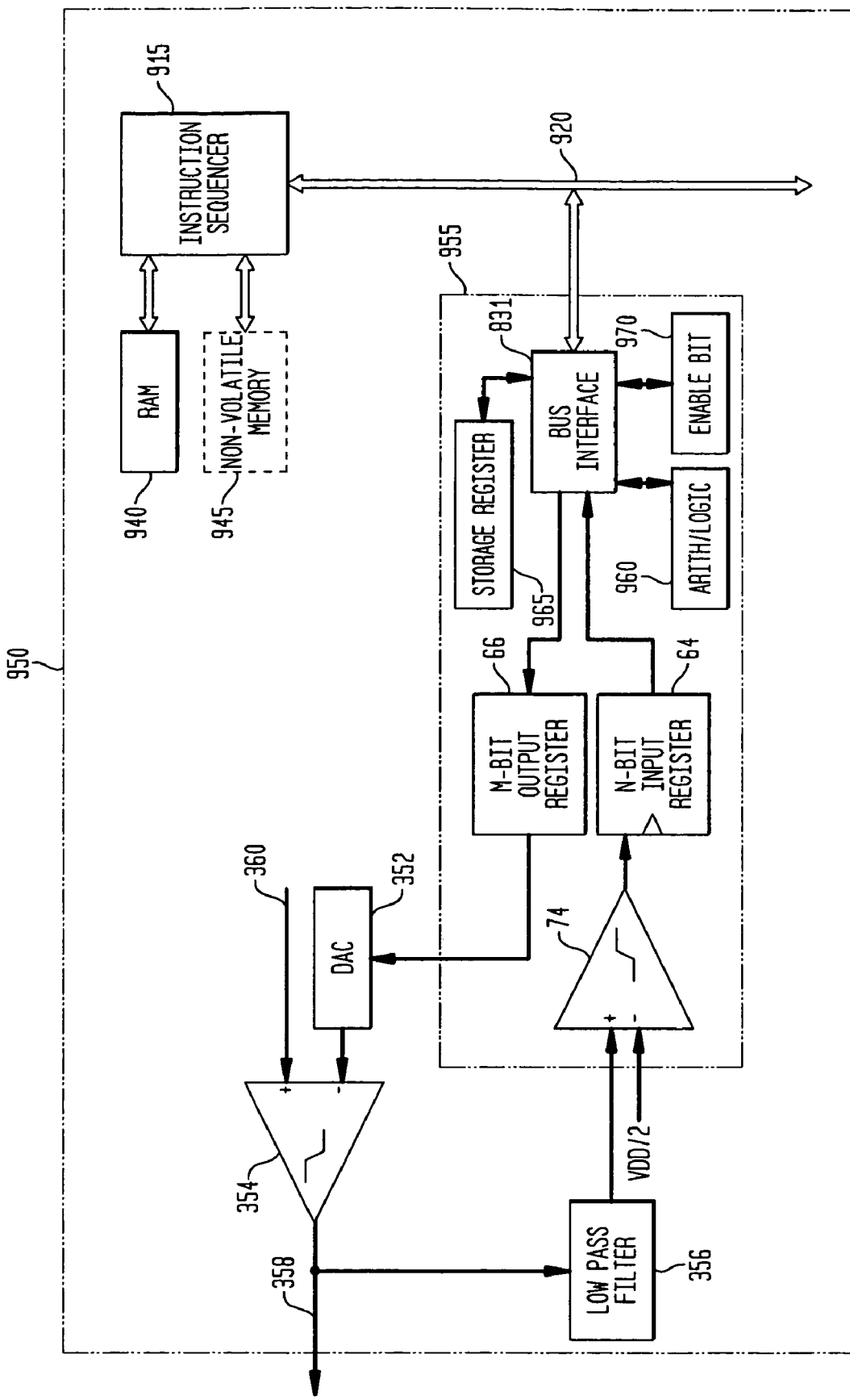
FIG. 22 is a schematic diagram of an embodiment of a system to control interface voltage operations for signals transmitted via a DDI.

FIG. 22 is a schematic diagram of an embodiment 950 of a system to at least in part control interface voltage operations. For simplicity, FIG. 22 shows a single voltage control circuit 955 coupled to the instruction sequencer 915 through bus 920 for the purpose of illustrating control of timing operations for a single link of a DDI. However, it should be apparent that, as illustrated in FIG. 19, system 950 may comprise multiple interface timing control circuits 955 coupled to sequencer 915 through bus 920 which correspond with multiple links of the DDI.

In a preferred embodiment, the system of FIG. 22 operates like the system of FIG. 4 with the exception that the functions carried out by the combination of FIG. 4's processor 54, RAM 80, memory 82, and bus 52 are carried out by the combination of FIG. 22's instruction sequencer 915, processing element 960, storage register 965, enable bit 970, RAM 940, non-volatile memory 945, and bus 920.

In each of the embodiments of FIGS. 19, 21 and 22, a general purpose processor may be substituted for the instruction sequencer. For example, the processor 54 of FIGS. 2A, 3 and 4 may be used to perform the functions of the instruction sequencer. Accordingly, alternatives to the instruction sequencer include general purpose processors, special purpose processors, controllers and/or microcontrollers that may be used for the execution of instructions such as those formatted, compiled, translated, or otherwise derived from high-level programming languages, regardless of type (e.g., procedural, object oriented or any other type of programming language) into machine readable instructions.

Figure 23:
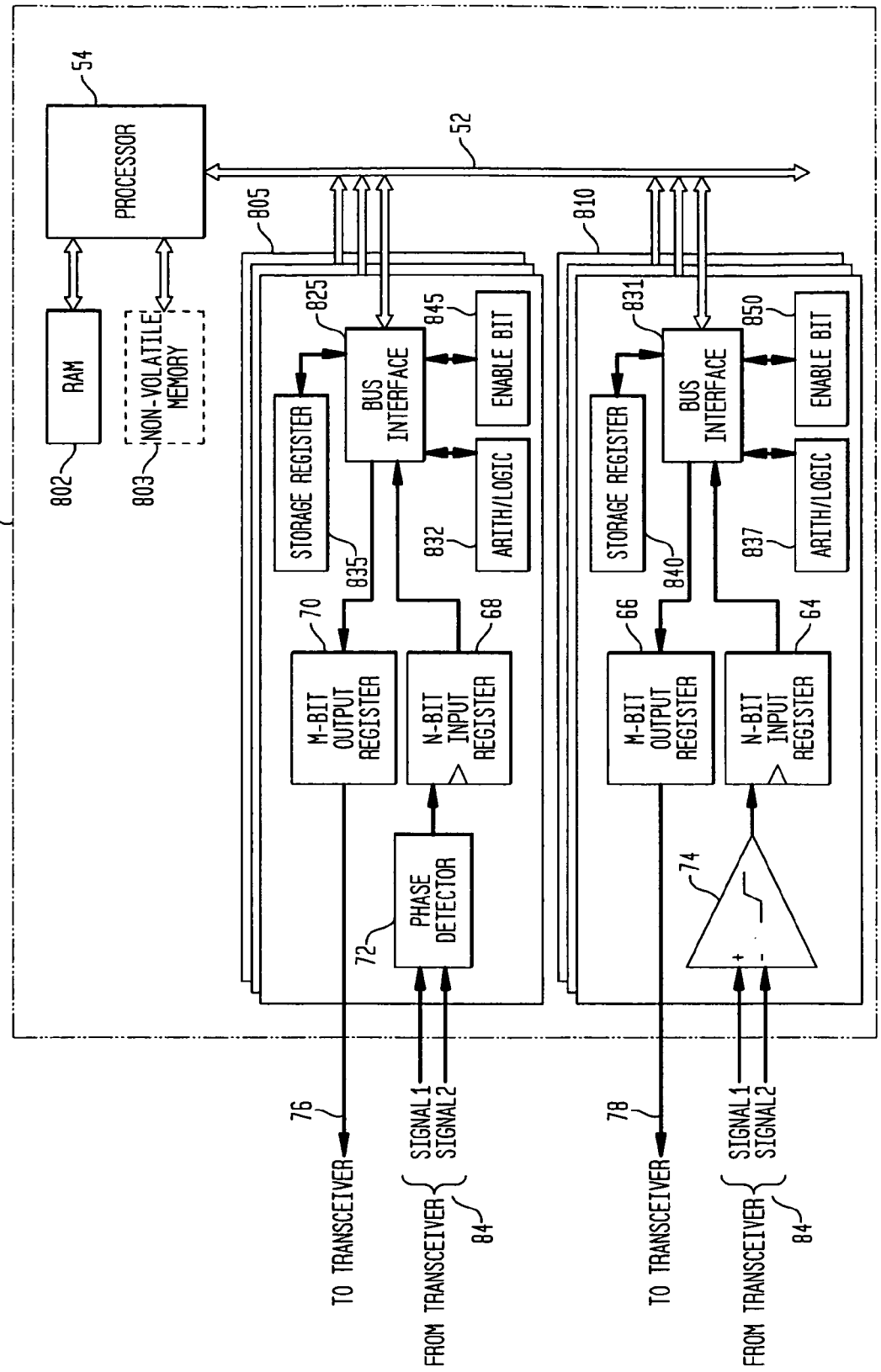
FIG. 23 is a schematic diagram of an embodiment of an interface control system capable of multi-mode operation.

Further, an interface control system in accordance with an embodiment may be configured to be operable in multiple modes. In one such embodiment, the system may be operable in a SIMD mode and a non-SIMD mode. FIG. 23 shows an illustrative embodiment of a system 975 capable of two modes of operation. The system of FIG. 23 is similar to the system of FIG. 19, with the exception that processor 54 and bus 52 have been substituted for instruction sequencer 820 and bus 818. In a preferred embodiment, the processor 54 is a microcontroller that has at least two unused opcode values. Two of the unused opcode values are respectively assigned to denote the SIMD mode and the non-SIMD mode. Thus, when the opcode for the SIMD mode is broadcast from processor 54 to the interface control circuits, the circuits are switched to the SIMD mode, and when the opcode for the non-SIMD mode is broadcast, the circuits are switched to the non-SIMD mode. As an alternative, an additional "wire" can be added to bus 52 to carry a bit or signal indicating a selected mode. In any case, when the system is in the SIMD mode the processor serves as an instruction sequencer, and when the system is not in the SIMD mode the processor serves as it does in the FIG. 2A embodiment.

Still further, an interface control system in accordance with an embodiment may be configured to have multiple modes of SIMD operation. For example, the system of FIG. 23 may be operable in a first SIMD mode in which the execution of opcodes by the processing elements 832 and 837 are conditioned on the state of enable bits 845 and 850, and in a second SIMD mode in which the execution of opcodes by the processing elements 832 and 837 are not conditioned on the state of enable bits 845 and 850. In a preferred implementation of such a system, the processor 54 is a microcontroller that has at least two unused opcode values. Two of the unused opcode values are respectively assigned to denote the first SIMD mode and the second SIMD mode. As an alternative, additional "wires" can be added to bus 52 to carry a multiple of bits or signals to indicate a selected mode.

Moreover, a multiple mode embodiment may include three or more modes. For example, a multiple mode embodiment may include a first SIMD mode, a second SIMD mode and a non-SIMD mode. In a preferred implementation of such an embodiment, the processor 54 is a microcontroller that has at least three unused opcode values. Three of the unused opcode values are respectively assigned to denote the first SIMD mode, the second SIMD mode, and the non-SIMD mode. As an alternative, additional "wires" can be added to bus 52 to carry a multiple of bits or signals to indicate a selected mode. In any case, when the system is in a SIMD mode the processor serves as an instruction sequencer, and when the system is not in a SIMD mode the processor serves as it does in the FIG. 2A embodiment.

It should be noted that in an alternative configuration of the FIG. 23 system, the system includes both a processor 54 (as shown) and an instruction sequencer (not shown). In such configuration, both the processor and instruction sequencer are coupled to bus 52. The processor is used to execute operations in a non-SIMD mode and the instruction sequencer is used to transmit opcodes in a SIMD mode.

In yet another embodiment, processing elements such as those discussed in connection with FIGS. 19-23 perform all interface control circuit processing without any input from an instruction sequencer or processor. Accordingly, the circuitry for implementing such an embodiment does not require either a processor or an instruction sequencer. Nevertheless, a processor and/or instruction sequencer may be included in the implementation for purposes of operation in an alternative mode, or in multiple alternative modes, in which the processing elements do not perform all of the interface control circuit processing.

In the preceding description and in the accompanying drawings, specific terminology and drawing symbols are set forth to provide a thorough understanding of claimed subject matter. In some instances, the terminology and symbols may imply specific details that are not required to practice the claimed subject matter. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. Also signals referred to herein as clock signals may alternatively be strobe signals or other signals that provide event timing. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur if the signal driving circuit is transitioned to a high impedance condition, such as an open drain or open collector condition).

It should be noted that the various circuits disclosed herein may be described using computer aided design tools and expressed (or represented), as data and/or instructions embodied in various machine-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Storage media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

If received within a computer system via one or more machine-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

While there has been illustrated and described what are presently considered to be example embodiments, it will be understood by those skilled in the art that various other modifications may be made, and equivalents may be substituted, without departing from the claimed subject matter. Additionally, many modifications may be made to adapt a particular situation to the teachings of the claimed subject matter without departing from the central concept described herein. Therefore, it is intended that the claimed subject matter not be limited to the particular embodiments disclosed, but that the claimed subject matter may also include all embodiments falling within the scope of the appended claims, and equivalents thereof.

The invention claimed is:

1. A circuit comprising:
a processor to implement control of interface operations;
a bus coupled to said processor; and
a plurality of interface control circuits coupled to said bus, a respective interface control circuit comprising a respective processing element,
wherein the respective interface control circuit is configured to receive one or more respective signals from one or more respective devices external to the circuit;
wherein the respective interface control circuit is further configured to process the one or more respective received signals to generate one or more respective interface adjustment signals based on results of operations performed by at least one of: the respective processing element and the processor, said operations using information derived from the one or more respective received signals, and
wherein the circuit is operable in at least two modes, including a first mode in which said interface control circuits are operable to generate one or more interface adjustment signals based on the results of operations performed by said processing elements in response to one or more opcodes transmitted by said processor, and a second mode in which said interface control circuits are operable to generate one or more interface adjustment signals based on the results of operations performed by said processor using said information derived from the one or more respective received signals.

2. The circuit of claim 1, wherein said processing elements are selectively enabled or disabled according to the state of respective enable bits.

3. The circuit of claim 1, wherein the circuit is operable in at least two modes, including a first mode in which said processing elements are selectively enabled or disabled according to the state of respective enable bits, and a second mode in which said processing elements are enabled.

4. The circuit of claim 1 wherein, in said first mode, said interface control circuits are operable to generate said interface adjustment signals without sending said information derived from said signals to said processors.

5. The circuit of claim 1, wherein the circuit is an integrated circuit.

6. The circuit of claim 1, wherein the interface adjustment signals comprise at least one interface timing adjustment signal for controlling, in an interface control circuit of the plurality of interface control circuits, one or more timing characteristics of one or more signals used in the transmission, encoding, reception, detection, decoding or other processing of information.

7. The circuit of claim 1, wherein the interface adjustment signals comprise at least one interface voltage adjustment signal for controlling, in an interface control circuit of the plurality of interface control circuits, one or more voltage characteristics of one or more signals used in the transmission, encoding, reception, detection, decoding or other processing of information.

8. The circuit of claim 1, wherein the interface adjustment signals comprise at least one of interface timing adjustment signals and interface voltage adjustment signals for controlling, in an interface control circuit of the plurality of interface control circuits, at least one of one or more timing characteristics and one or more voltage characteristics of one or more signals used in the transmission, encoding, reception, detection, decoding or other processing of information.

9. A method for generating interface adjustment signals, performed at a circuit with a processor and a plurality of interface control circuits, a respective interface control circuit comprising a respective processing element, the method comprising the steps of:

receiving, at a respective interface control circuit, one or more respective signals from one or more respective devices external to the circuit;

processing, at the respective interface control circuit, the one or more respective received signals to generate one or more respective interface adjustment signals based on results of operations performed by at least one of: the respective processing element and the processor, said operations using information derived from the one or more respective received signals;

wherein, in a first mode of the circuit, said interface control circuits are operable to generate one or more interface adjustment signals based on the results of operations performed by said processing elements of said plurality of interface control circuits in response to one or more opcodes transmitted by said processor, in a second mode of the circuit, said interface control circuits are operable to generate one or more interface adjustment signals based on the results of operations performed by said processor using said information derived from the one or more respective received signals.

10. The method of claim 9, including said processor transmitting the one or more opcodes to said plurality of interface control circuits.

11. The method of claim 9, including selectively enabling or disabling said processing elements according to the state of respective enable bits.

12. The method of claim 9, wherein the circuit is an integrated circuit.

13. The method of claim 9, wherein the interface adjustment signals comprise at least one interface timing adjustment signal for controlling, in an interface control circuit of the plurality of interface control circuits, one or more timing characteristics of one or more signals used in the transmission, encoding, reception, detection, decoding or other processing of information.

14. The method of claim 9, wherein the interface adjustment signals comprise at least one interface voltage adjustment signal for controlling, in an interface control circuit of the plurality of interface control circuits, one or more voltage characteristics of one or more signals used in the transmission, encoding, reception, detection, decoding or other processing of information.

15. The method of claim 9, wherein the interface adjustment signals comprise at least one of interface timing adjustment signals and interface voltage adjustment signals for controlling, in an interface control circuit of the plurality of interface control circuits, at least one of one or more timing characteristics and one or more voltage characteristics of one or more signals used in the transmission, encoding, reception, detection, decoding or other processing of information.

* * * * *